United States Patent
Lin et al.

(10) Patent No.: US 9,941,260 B2
(45) Date of Patent: Apr. 10, 2018

(54) FAN-OUT PACKAGE STRUCTURE HAVING EMBEDDED PACKAGE SUBSTRATE

(71) Applicant: MediaTek Inc., Hsin-Chu (TW)

(72) Inventors: Tzu-Hung Lin, Zhubei (TW); Chi-Chin Lien, Taipei (TW); Nai-Wei Liu, Kaohsiung (TW); I-Hsuan Peng, Hsinchu (TW); Ching-Wen Hsiao, Hsinchu (TW); Wei-Che Huang, Zhudong Township, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/203,418

(22) Filed: Jul. 6, 2016

(65) Prior Publication Data

US 2017/0077073 A1  Mar. 16, 2017

Related U.S. Application Data

(60) Provisional application No. 62/264,949, filed on Dec. 9, 2015, provisional application No. 62/219,240, filed on Sep. 16, 2015.

(51) Int. Cl.
*H01L 23/00* (2006.01)
*H01L 25/10* (2006.01)
(Continued)

(52) U.S. Cl.
CPC ...... *H01L 25/105* (2013.01); *H01L 23/49833* (2013.01); *H01L 25/50* (2013.01); *H01L 23/49816* (2013.01); *H01L 23/5389* (2013.01); *H01L 25/0657* (2013.01); *H01L 2224/0401* (2013.01); *H01L 2224/131* (2013.01); *H01L 2224/13147* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01);
(Continued)

(58) Field of Classification Search
CPC ..................................................... H01L 23/562
See application file for complete search history.

(56) References Cited

U.S. PATENT DOCUMENTS

2004/0080041 A1* 4/2004 Kimura ............... H01L 23/36
257/706
2010/0044845 A1   2/2010 Funaya et al.
(Continued)

OTHER PUBLICATIONS

Extended European Search Report for Application No. EP 16186286.7 dated Jun. 27, 2017.

*Primary Examiner* — William Harriston
(74) *Attorney, Agent, or Firm* — Wolf, Greenfield & Sacks, P.C.

(57) ABSTRACT

A semiconductor package structure is provided. The semiconductor package structure includes a first semiconductor package that includes a first semiconductor die having a first surface and a second surface opposite thereto. A first package substrate is disposed on the first surface of the first semiconductor die. A first molding compound surrounds the first semiconductor die and the first package substrate. A first redistribution layer (RDL) structure is disposed on the first molding compound, in which the first package substrate is interposed and electrically coupled between the first semiconductor die and the first RDL structure.

26 Claims, 23 Drawing Sheets

(51) Int. Cl.
*H01L 25/00* (2006.01)
*H01L 23/498* (2006.01)
*H01L 23/538* (2006.01)
*H01L 25/065* (2006.01)

(52) U.S. Cl.
CPC ........... *H01L 2224/73204* (2013.01); *H01L 2224/73253* (2013.01); *H01L 2224/73265* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2225/1094* (2013.01); *H01L 2924/15311* (2013.01); *H01L 2924/15331* (2013.01); *H01L 2924/3511* (2013.01)

(56) References Cited

U.S. PATENT DOCUMENTS

| | | |
|---|---|---|
| 2010/0133704 A1* | 6/2010 | Marimuthu ........... H01L 21/565 257/778 |
| 2012/0074585 A1 | 3/2012 | Koo et al. |
| 2012/0153445 A1 | 6/2012 | Son et al. |
| 2013/0070438 A1 | 3/2013 | Choi et al. |
| 2013/0075927 A1* | 3/2013 | Chi ..................... H01L 23/3135 257/774 |
| 2014/0183732 A1 | 7/2014 | Huang et al. |
| 2015/0255361 A1* | 9/2015 | Lee .................... H01L 23/3135 257/738 |

* cited by examiner

FAN-OUT PACKAGE STRUCTURE HAVING EMBEDDED PACKAGE SUBSTRATE

CROSS REFERENCE TO RELATED APPLICATIONS

This application claims the benefit of U.S. Provisional Application No. 62/219,240 filed on Sep. 16, 2015 and U.S. Provisional Application No. 62/264,949 filed on Dec. 9, 2015, the entirety of which is incorporated by reference herein.

BACKGROUND OF THE INVENTION

Field of the Invention

The present invention relates to a semiconductor package structure, and in particular to a highly cost-effective fan-out flip-chip package structure.

Description of the Related Art

In the semiconductor packaging industry, there is a desire for reducing the cost of packaging semiconductor dies. To accomplish this, a wide variety of package structure designs have been developed. One of the package structure designs currently in use is the flip-chip package structure.

In a flip-chip package structure, a semiconductor die (also referred to as an integrated circuit (IC) chip or "chip") that is formed with solder bumps is typically bonded directly to metal pads of a package substrate. Such solder bumps are affixed to I/O bonding pads of the semiconductor die. During packaging, the semiconductor die is "flipped" so that the solder bumps form electrical interconnections between the semiconductor die and the packaging substrate. Flip chip package technology provides higher speed electrical performance than earlier wire bond technology, since this greatly shortens the interconnection path between the semiconductor die and the package substrate.

In order to ensure miniaturization and multi-functionality of electronic products, it is desired that semiconductor packages are small in size, operate at high speeds, and have high functionality. Accordingly, the semiconductor die needs to have more I/O pads put into a smaller area, and utilizes the package substrate to serve as a fan-out layer.

However, in order to respond to the increase in I/O pads, a complicated multilayer interconnect structure is formed in the package substrate. As a result, the dimensions and the manufacturing cost of the package substrate are greatly increased, while the yield of the package substrate is reduced. These cause reductions in the reliability, yield, and throughput of the semiconductor package structure, while the manufacturing cost of the semiconductor package structure goes up.

Thus, a novel semiconductor package structure is desirable.

BRIEF SUMMARY OF THE INVENTION

Semiconductor package structures are provided. An exemplary embodiment of a semiconductor package structure includes a first semiconductor package. The first semiconductor package includes a first semiconductor die having a first surface and a second surface opposite thereto. The first semiconductor package further includes a first package substrate disposed on the first surface of the first semiconductor die. The first semiconductor package further includes a first molding compound surrounding the first semiconductor die and the first package substrate. The first semiconductor package further includes a first redistribution layer (RDL) structure disposed on the first molding compound. The first package substrate is interposed and electrically coupled between the first semiconductor die and the first RDL structure.

Another exemplary embodiment of a semiconductor package structure includes a first semiconductor package and a second semiconductor package disposed thereon. The first semiconductor package includes a first semiconductor die having a first surface and a second surface opposite thereto. The first semiconductor package further includes a first package substrate disposed on the first surface of the first semiconductor die. The first semiconductor package further includes a first molding compound surrounding the first semiconductor die and the first package substrate. The first semiconductor package further includes a first RDL structure disposed on the first molding compound. The first package substrate is interposed and electrically coupled between the first semiconductor die and the first RDL structure. The second semiconductor package includes at least one second semiconductor die disposed over the first molding compound. The second semiconductor package further includes a second package substrate disposed between the second semiconductor die and the first molding compound and electrically coupled between the second semiconductor die and the first package substrate. The second semiconductor package further includes a second molding compound covering the second semiconductor die and the second package substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
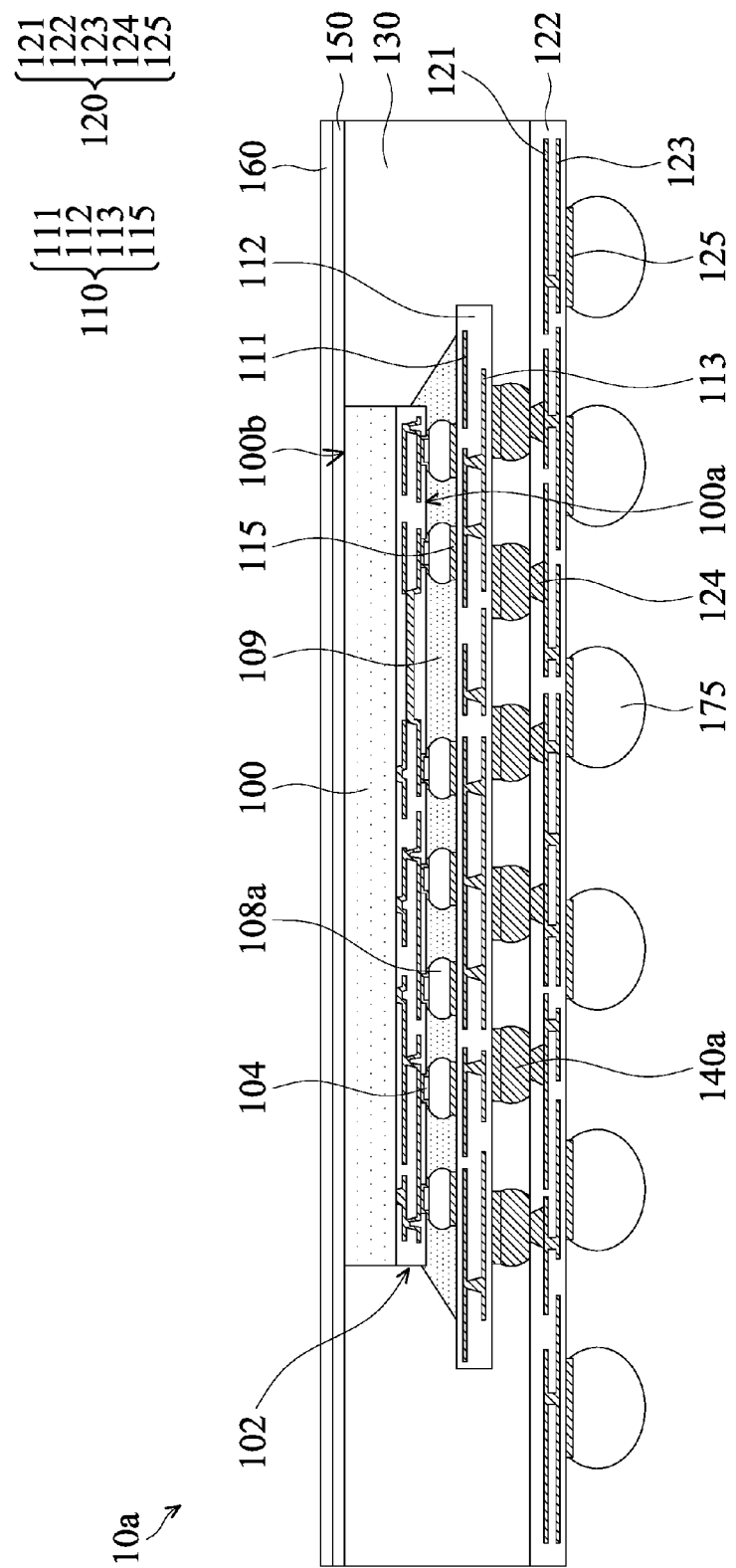
FIG. 1A is a cross-sectional view of a semiconductor package structure in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1A is a cross-sectional view of a semiconductor package structure 10a in accordance with some embodiments of the disclosure. In some embodiments, the semiconductor package structure 10a is a wafer-level semiconductor package structure, for example, a fan-out wafer-level semiconductor package structure. In one embodiment, the fan-out wafer-level semiconductor package structure may include a system-on-chip (SOC) package structure.

Referring to FIG. 1A, the semiconductor package structure 10a may include a first semiconductor package (e.g., a fan-out wafer-level semiconductor package) that may be mounted on a base (not shown), such as a printed circuit board (PCB), that is formed of polypropylene (PP), polybenzoxazole (PBO) or polyimide. In some embodiments, the base may be a single layer or a multilayer structure. Conductive pads and conductive traces electrically coupled thereto are typically disposed on the top surface of the base and/or in the base. In this case, the conductive traces may be used for the input/output (I/O) connections of the semiconductor package structure 10a. In some embodiments, the first semiconductor package of the semiconductor package structure 10a is mounted on the base by a bonding process. For example, the first semiconductor package includes bumps 175 that are mounted on and electrically coupled to the base by the bonding process.

In the embodiment, the first semiconductor package of the semiconductor package structure 10a includes a first semiconductor die 100. The first semiconductor die 100 has a first surface 100a and a second surface 100b opposite thereto. Moreover, the first semiconductor die 100 may include interconnect structure 102 that is electrically connected to the circuitry (not shown) of the first semiconductor die 100 and includes conductive pads 104 thereon. The interconnect structure 102, such as an RDL structure, includes one or more conductive traces disposed in an insulating layer and conductive pads 104 disposed on the insulating layer. In some embodiments, the first semiconductor die 100 (such as a system-on-chip (SOC) die) may include a logic die including a central processing unit (CPU), a graphics processing unit (GPU), a dynamic random access memory (DRAM) controller or any combination thereof. Alternatively, the first semiconductor die 100 may include a modem die.

In the embodiment, the first semiconductor package of the semiconductor package structure 10a further includes a first package substrate 110 disposed on the first surface 100a of the first semiconductor die 100 to serve as a fan-out layer. In the embodiment, the first package substrate 110 includes one or more conductive traces disposed in an insulating base 112 and one or more conductive pads disposed on an insulating base 112. For example, first conductive traces 111 are disposed at a first layer-level of the insulating base 112. One or more first conductive traces 111 are electrically coupled to the corresponding conductive pads 115. Moreover, second conductive traces 113 are disposed at a second layer-level, which is different from the first layer-level of the insulating base 112. In some embodiments, the insulating base 112 may be formed of organic materials, which include a polymer base material (e.g., PP, PBO or polyimide), or the like. It should be noted that the number of conductive traces and the number of conductive pads of the first package substrate 110 shown in FIG. 1A is only an example and is not a limitation to the present invention.

In the embodiment, the first package substrate 110 is electrically coupled to the first semiconductor die 100 via first conductive structures 108a (such as solder balls) that are embedded in an underfill material layer 109. For example, the conductive pads 115 of the first package substrate 110 are connected to the corresponding first conductive structures 108a that are connected to the corresponding conductive pads 104 of the interconnect structure 102 of the first semiconductor die 100.

In the embodiment, the first semiconductor package of the semiconductor package structure 10a further includes a first molding compound 130 surrounding the first semiconductor die 100, the first package substrate 110, and the underfill material layer 109 between the first semiconductor die 100 and the first package substrate 110. The second surface 100b of the first semiconductor die 100 is exposed from the first molding compound 130. In some embodiments, the first molding compound 130 may be formed of an epoxy, a resin, a moldable polymer, or the like. The first molding compound 130 may be applied while substantially liquid, and then may be cured through a chemical reaction, such as in an epoxy or resin. In some other embodiments, the first molding compound 130 may be an ultraviolet (UV) or thermally cured polymer applied as a gel or malleable solid capable of being disposed around the first semiconductor die 100, and then may be cured through a UV or thermal curing process. The first molding compound 130 may be cured with a mold (not shown).

In the embodiment, the first semiconductor package of the semiconductor package structure 10a further includes a first RDL structure 120 disposed on the first molding compound 130, so that the first package substrate 110 is interposed between the first semiconductor die 100 and the first RDL structure 120. Moreover, the first RDL structure 120 is electrically coupled to the first package substrate 110 via second conductive structures 140a, such as solder balls. In some embodiments, the first RDL structure 120, which is also referred to as a fan-out structure, has a sidewall that is substantially and vertically aligned with the corresponding sidewall of the first molding compound 130.

In the embodiment, the first RDL structure 120 has a structure that is similar to that of the first package substrate 110, so as to serve as a second fan-out layer. The first RDL structure 120 includes one or more conductive traces disposed in an inter-metal dielectric (IMD) layer 122. For example, first conductive traces 121 are disposed at a first layer-level of the IMD layer 122. At least one of the first conductive traces 121 has a pad portion 124 that is electrically coupled to the corresponding second conductive structure 140a. Moreover, second conductive traces 123 are disposed at a second layer-level, which is different from the first layer-level of the IMD layer 122. In some embodiments, the IMD layer 122 may be a single layer or a multi-layer structure that is formed of organic materials, which include a polymer base material, non-organic materials, which include silicon nitride ($SiN_x$), silicon oxide ($SiO_x$), graphene, or the like. In some embodiments, the IMD layer 122 is a high-k dielectric layer (k is the dielectric constant of the dielectric layer). In some other embodiments, the IMD layer 122 may be formed of a photo sensitive material, which includes a dry film photoresist, or a taping film.

Pad portions 125 of the second conductive traces 123 are on the IMD layer 122 and connected to the third conductive structures 175 (such as bumps), so that third conductive structures 175 are disposed on and electrically coupled to the first RDL structure, and the first RDL structure 120 is between the first package substrate 110 and the third conductive structures 175. Also, it should be noted that the number of conductive traces and the number of pad portions of the first RDL structure 120 shown in FIG. 1A is only an example and is not a limitation to the present invention.

In the embodiment, the first semiconductor package of the semiconductor package structure 10a further includes an adhesion layer 150 and a first protective layer 160. In the embodiment, the adhesion layer 150 (which is sometimes referred to as a die-attach film (DAF)) is used for attaching the first semiconductor die 100 onto a carrier (not shown) during fabrication of the semiconductor package structure 10a. The first protective layer 160 (which is sometimes referred to as a back side film (BSF)) is disposed over the second surface 100b of the first semiconductor die 100 and the first molding compound 130, so that the adhesion layer 150 is disposed between the first protective layer 160 and the first semiconductor die 100. In the embodiment, the first protective layer 160 is in direct contact with the adhesion layer 150, so as to protect the first semiconductor die 100 and the first molding compound 130 from being damaged.

Figure 1B:
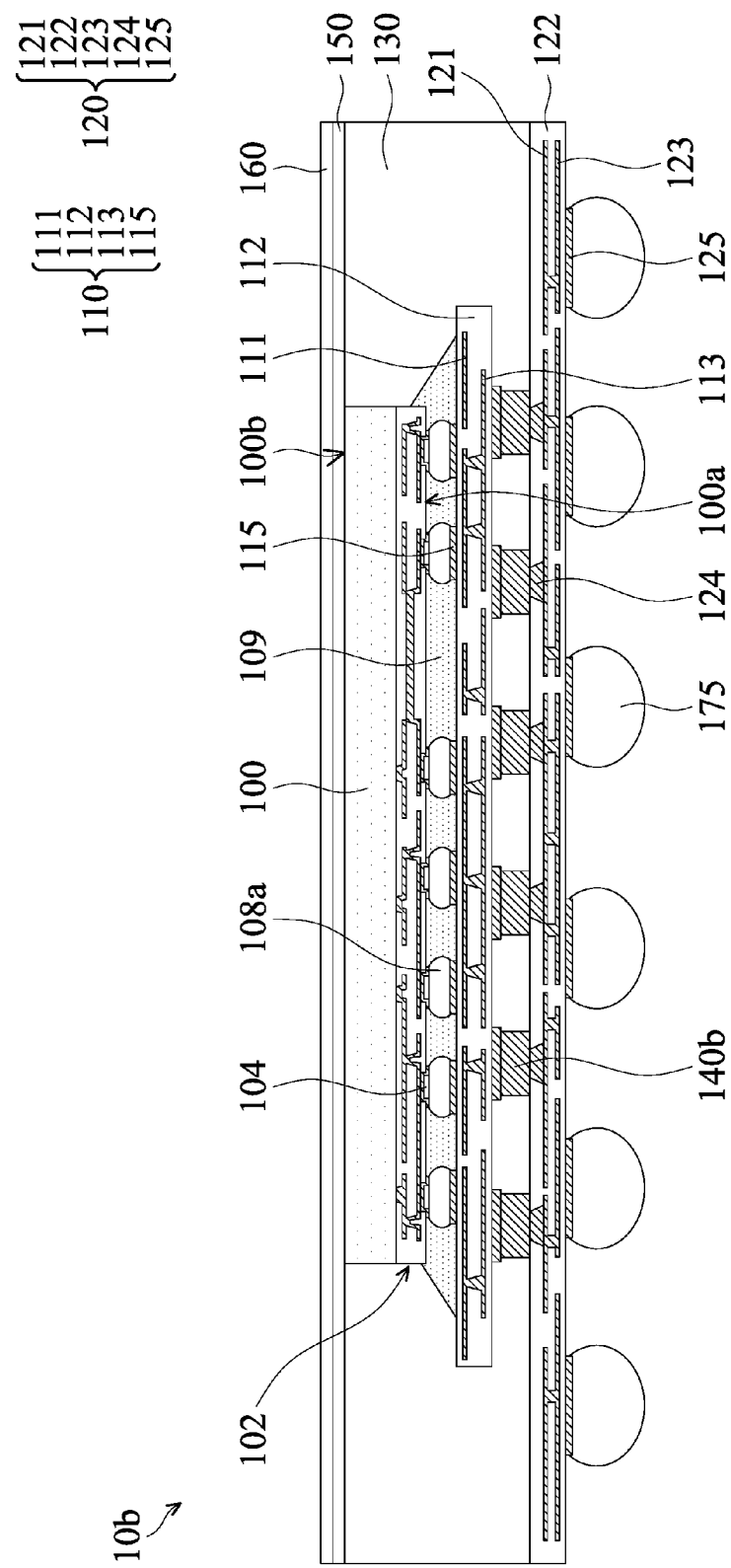
FIG. 1B is a cross-sectional view of a semiconductor package structure in accordance with some embodiments of the disclosure.

FIG. 1B is a cross-sectional view of a semiconductor package structure 10b in accordance with some embodiments of the disclosure. Descriptions of elements of the embodiments hereinafter that are the same as or similar to those previously described with reference to FIG. 1A may be omitted for brevity. In the embodiment, the semiconductor package structure 10b is similar to the semiconductor package structure 10a shown in FIG. 1A. As shown in FIG. 1B, unlike the semiconductor package structure 10a, the first semiconductor package of the package structure 10b includes second conductive structures 140b, such as copper pillars or bumps, that are electrically coupled between the first RDL structure 120 and the first package substrate 110.

Figure 1C:
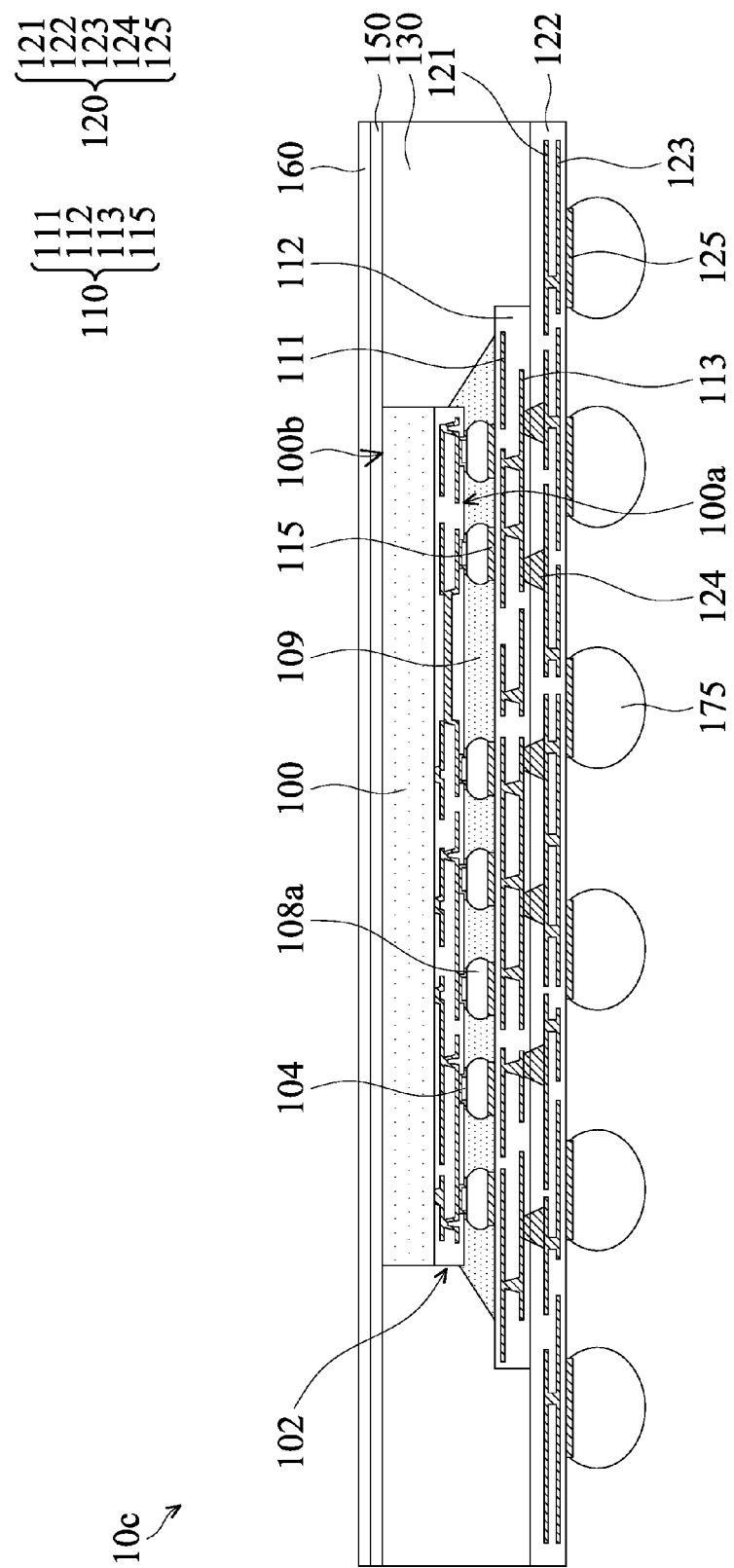
FIG. 1C is a cross-sectional view of a semiconductor package structure in accordance with some embodiments of the disclosure.

FIG. 1C is a cross-sectional view of a semiconductor package structure 10c in accordance with some embodiments of the disclosure. Descriptions of elements of the embodiments hereinafter that are the same as or similar to those previously described with reference to FIG. 1A may be omitted for brevity. In the embodiment, the semiconductor package structure 10c is similar to the semiconductor package structure 10a shown in FIG. 1A. As shown in FIG. 1C, unlike the semiconductor package structure 10a, in the first semiconductor package of the semiconductor package structure 10c, the first package substrate 110 is in direct contact with the first RDL structure 120. In the embodiment, for example, pad portions (not shown) of the second conductive traces 113 in the first package substrate 110 are bonded to the corresponding pad portions 124 of the first conductive traces 121 in the first RDL structure 120.

Figure 1D:
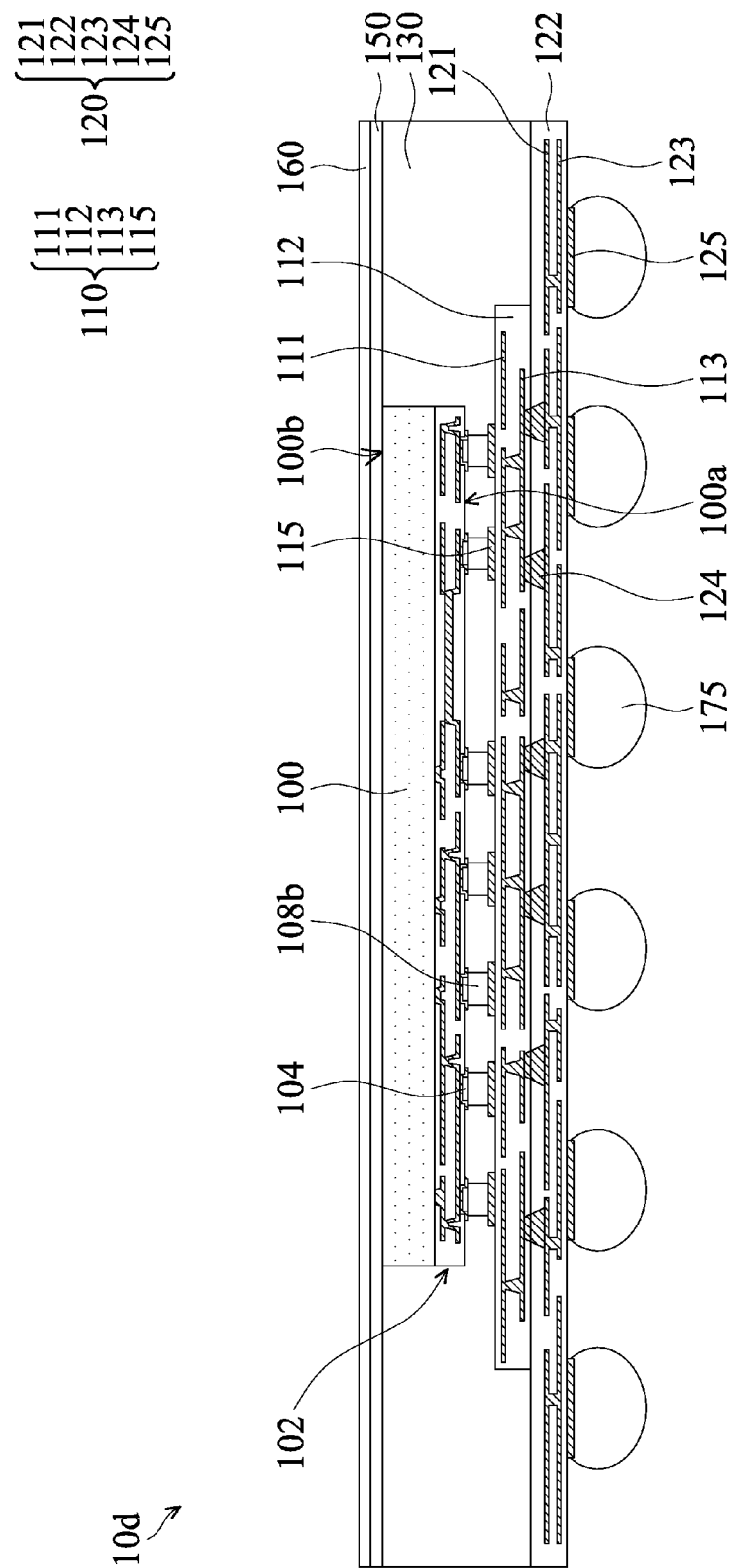
FIG. 1D is a cross-sectional view of a semiconductor package structure in accordance with some embodiments of the disclosure.

FIG. 1D is a cross-sectional view of a semiconductor package structure 10d in accordance with some embodiments of the disclosure. Descriptions of elements of the embodiments hereinafter that are the same as or similar to those previously described with reference to FIG. 1C may be omitted for brevity. In the embodiment, the semiconductor package structure 10d is similar to the semiconductor package structure 10c shown in FIG. 1C. As shown in FIG. 1D, unlike the semiconductor package structure 10c, the first semiconductor package of the package structure 10d includes first conductive structures 108b (such as copper bumps or pillars) that are electrically coupled between the first package substrate 110 and the first semiconductor die 100. In the embodiment, for example, the conductive pads 115 of the first package substrate 110 are connected to the corresponding copper bumps or pillars (i.e., the first conductive structures 108b) that are connected to the corresponding conductive pads 104 of the interconnect structure 102 of the first semiconductor die 100. In the embodiment, although the first package substrate 110 is in direct contact with the first RDL structure 120, the package structure 10d may include second conductive structures 140a (as shown in FIG. 1A) or second conductive structures 140b (as shown in FIG. 1B), so as to be electrically coupled between the first RDL structure 120 and the first package substrate 110.

Figure 2A:
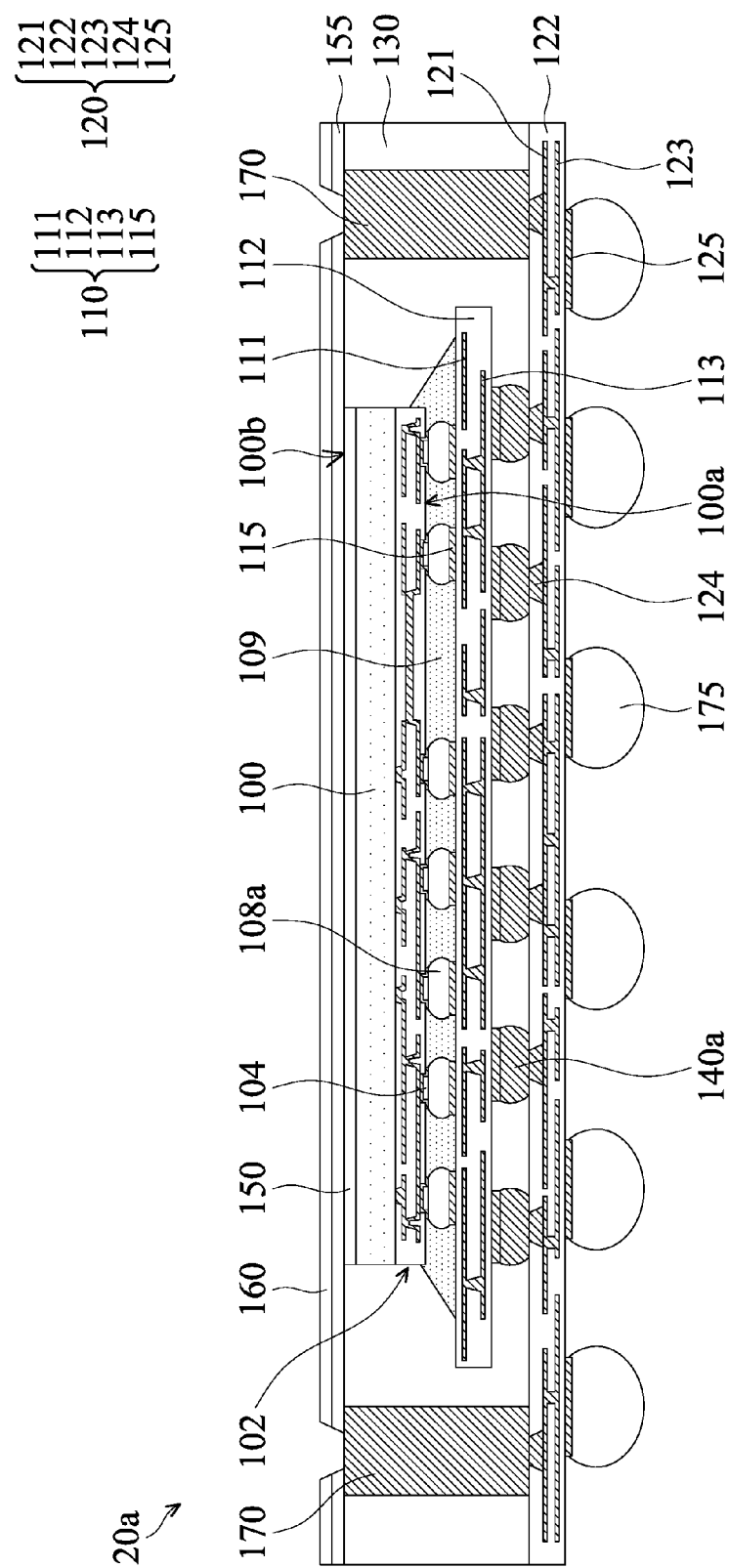
FIG. 2A is a cross-sectional view of a semiconductor package structure with through e vias in accordance with some embodiments of the disclosure.

FIG. 2A is a cross-sectional view of a semiconductor package structure 20a with through vias in accordance with some embodiments of the disclosure. Descriptions of elements of the embodiments hereinafter that are the same as or similar to those previously described with reference to FIG. 1A may be omitted for brevity. In the embodiment, the semiconductor package structure 20a is similar to the semiconductor package structure 10a shown in FIG. 1A. As shown in FIG. 2A, unlike the semiconductor package structure 10a, the first semiconductor package of the semiconductor package structure 20a further includes through vias 170 (which are sometimes referred to as through package vias (TPVs) or through interposer vias (TIVs)) passing through the first molding compound 130 and electrically coupled to the first RDL structure 120 via the pad portions 124 of the first conductive traces 121. In some embodiments, the first semiconductor die 100 may be surrounded by the through vias 170. Moreover, the through vias 170 may be formed of copper.

In the embodiment, the first semiconductor package of the semiconductor package structure 20a further includes a second protective layer 155 disposed between the first protective layer 160 and the adhesion layer 150. In this case, the adhesion layer 150 may be surrounded by the first molding compound 130. The second protective layer 155 protects the underlying adhesion layer 150 from being damaged during forming the through vias 170. In some embodiments, the first and second protective layers 160 and 155 have openings to expose the through via(s) 170 in the first molding compound 130. Moreover, an optional solder material (not shown) may fill these openings to contact the exposed through vias 170, thereby facilitating the bonding process for Package-on-Package (PoP) fabrication.

Figure 2B:
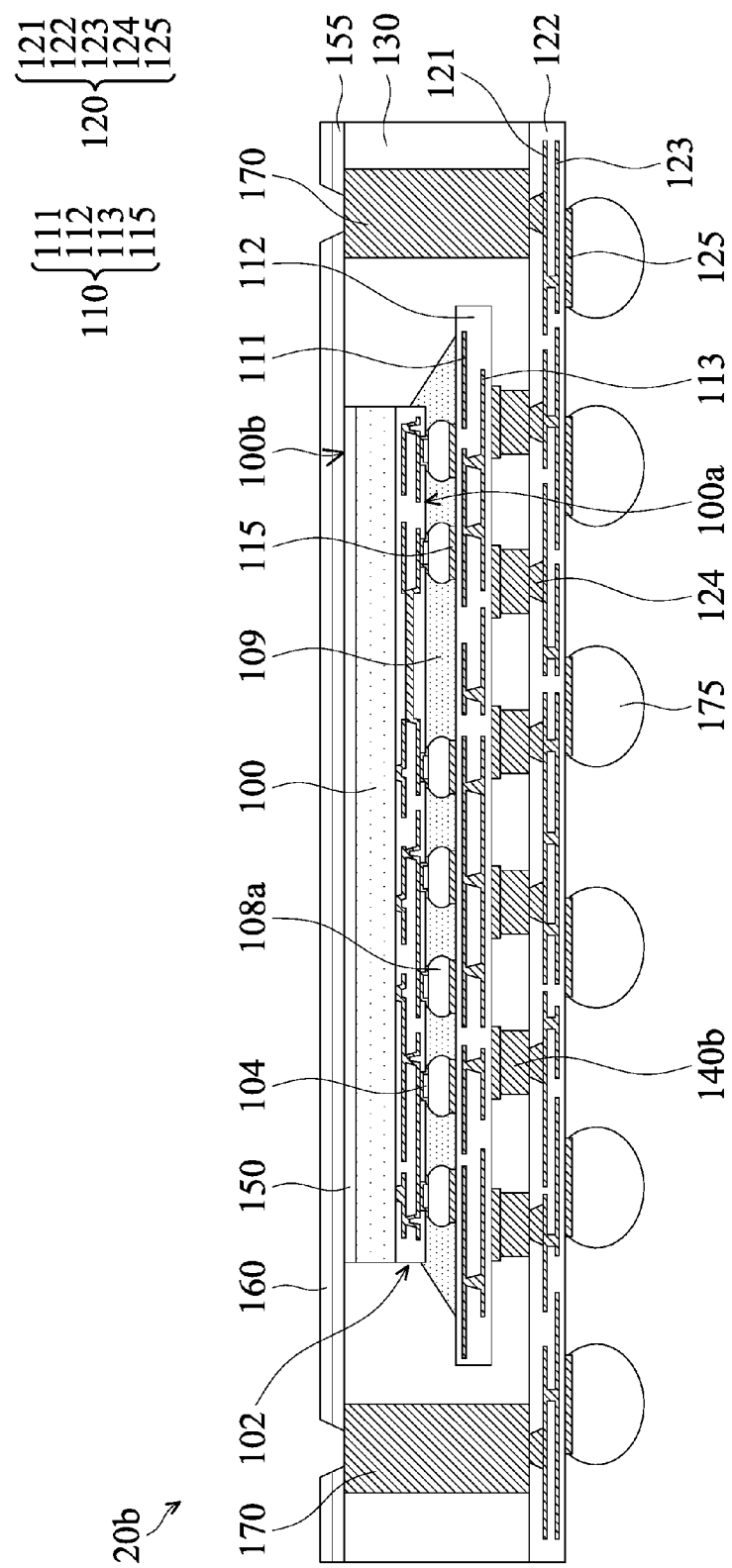
FIG. 2B is a cross-sectional view of a semiconductor package structure with through e vias in accordance with some embodiments of the disclosure.

FIG. 2B is a cross-sectional view of a semiconductor package structure 20b with through vias in accordance with some embodiments of the disclosure. Descriptions of elements of the embodiments hereinafter that are the same as or similar to those previously described with reference to FIG. 2A may be omitted for brevity. In the embodiment, the semiconductor package structure 20b is similar to the semiconductor package structure 20a shown in FIG. 2A. As shown in FIG. 2B, unlike the semiconductor package structure 20a, the first semiconductor package of the semiconductor package structure 20b includes second conductive structures 140b, such as copper pillars or bumps, that are electrically coupled between the first RDL structure 120 and the first package substrate 110.

Figure 2C:
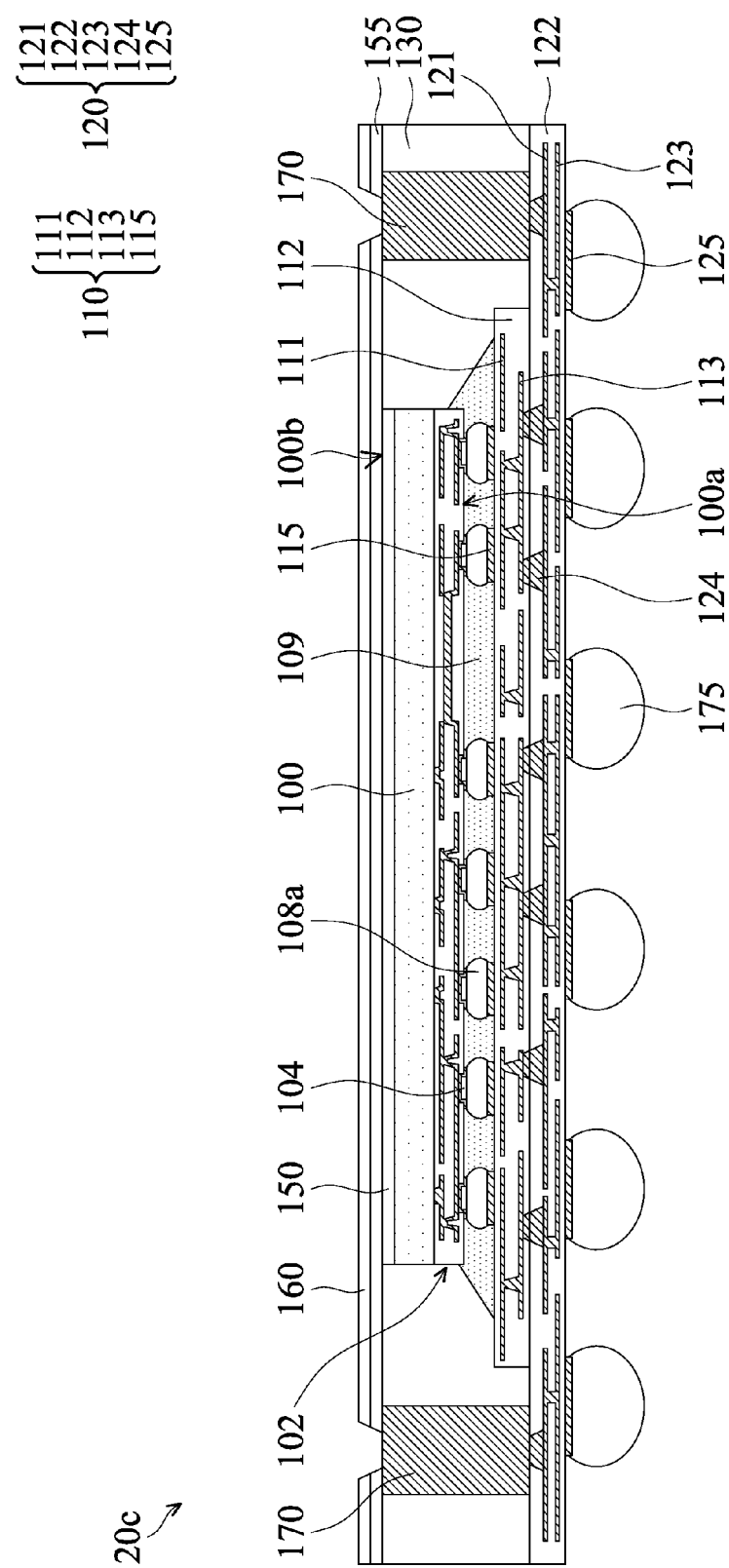
FIG. 2C is a cross-sectional view of a semiconductor package structure with through e vias in accordance with some embodiments of the disclosure.

FIG. 2C is a cross-sectional view of a semiconductor package structure 20c with through vias in accordance with some embodiments of the disclosure. Descriptions of elements of the embodiments hereinafter that are the same as or similar to those previously described with reference to FIG. 2A may be omitted for brevity. In the embodiment, the semiconductor package structure 20c is similar to the semiconductor package structure 20a shown in FIG. 2A. As shown in FIG. 2C, unlike the semiconductor package structure 20a, in the first semiconductor package of the semiconductor package structure 20c, the first package substrate 110 is in direct contact with the first RDL structure 120. In the embodiment, for example, pad portions (not shown) of the second conductive traces 113 in the first package substrate 110 are bonded to the corresponding pad portions 124 of the first conductive traces 121 in the first RDL structure 120.

Figure 2D:
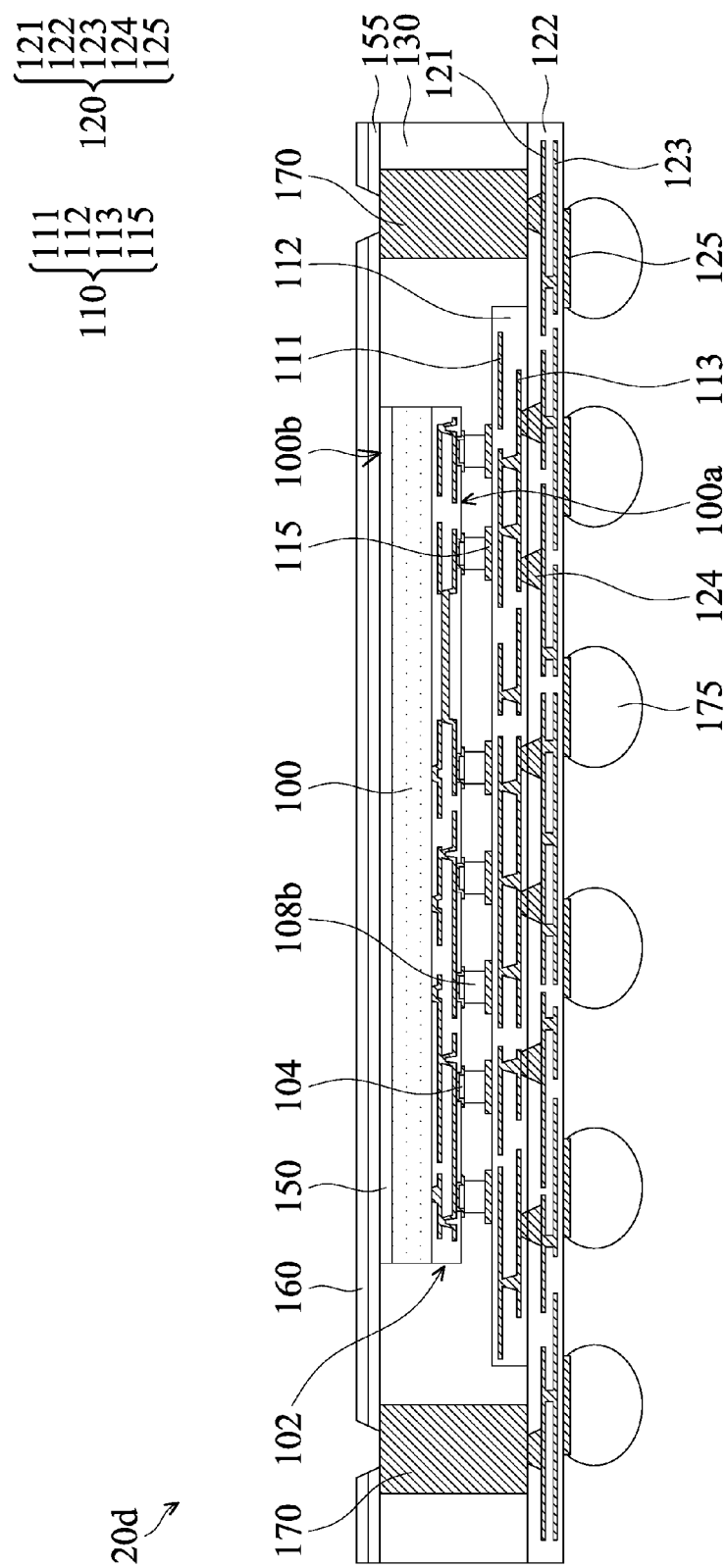
FIG. 2D is a cross-sectional view of a semiconductor package structure with through e vias in accordance with some embodiments of the disclosure.

FIG. 2D is a cross-sectional view of a semiconductor package structure 20d with through vias in accordance with some embodiments of the disclosure. Descriptions of elements of the embodiments hereinafter that are the same as or similar to those previously described with reference to FIG. 2C may be omitted for brevity. In the embodiment, the semiconductor package structure 20d is similar to the semiconductor package structure 20c shown in FIG. 2C. As shown in FIG. 2D, unlike the semiconductor package structure 20c, the first semiconductor package of the package structure 20d includes conductive structures 108b (such as copper bumps or pillars) that are electrically coupled between the first package substrate 110 and the first semiconductor die 100. In the embodiment, for example, the conductive pads 115 of the first package substrate 110 are connected to the corresponding copper bumps or pillars (i.e., the first conductive structures 108b) that are connected to the corresponding conductive pads 104 of the interconnect structure 102 of the first semiconductor die 100.

Figure 2E:
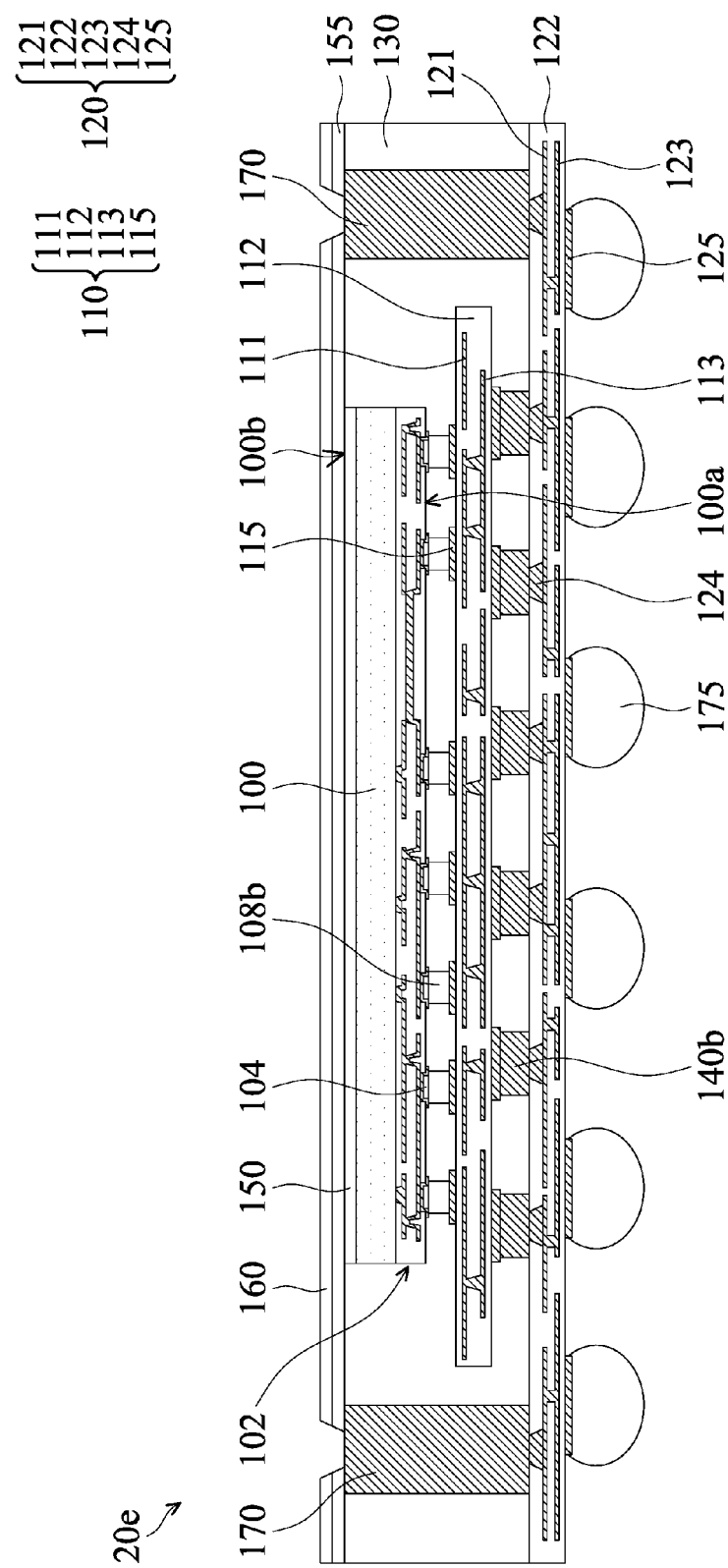
FIG. 2E is a cross-sectional view of a semiconductor package structure with through e vias in accordance with some embodiments of the disclosure.

FIG. 2E is a cross-sectional view of a semiconductor package structure 20e with through vias in accordance with some embodiments of the disclosure. Descriptions of elements of the embodiments hereinafter that are the same as or similar to those previously described with reference to FIG. 2D may be omitted for brevity. In the embodiment, the semiconductor package structure 20e is similar to the semiconductor package structure 20d shown in FIG. 2D. As shown in FIG. 2E, unlike the semiconductor package structure 20d, the first semiconductor package of the semiconductor package structure 20e includes second conductive structures 140b, such as copper pillars or bumps, that are electrically coupled between the first RDL structure 120 and the first package substrate 110.

Figure 2F:
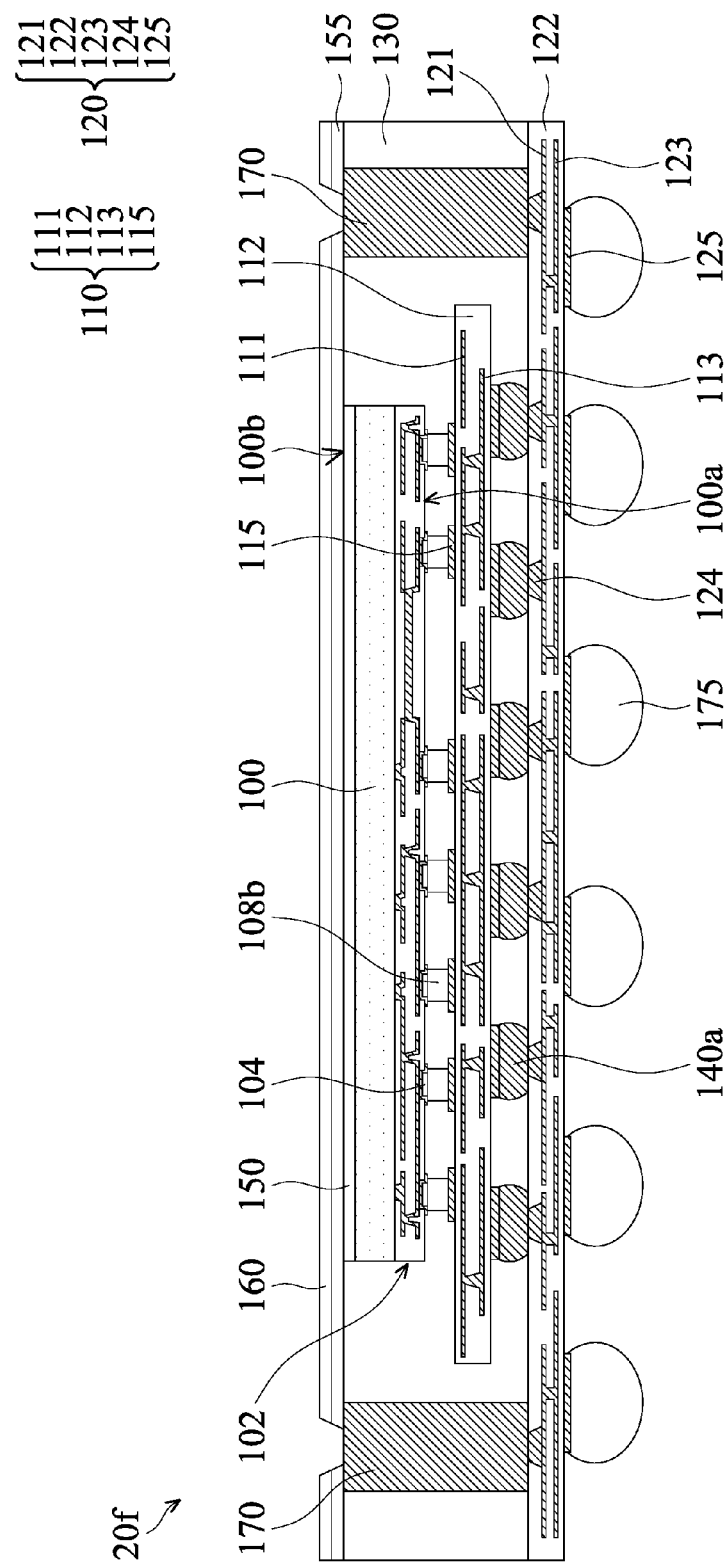
FIG. 2F is a cross-sectional view of a semiconductor package structure with through e vias in accordance with some embodiments of the disclosure.

FIG. 2F is a cross-sectional view of a semiconductor package structure 20e with through vias in accordance with some embodiments of the disclosure. Descriptions of elements of the embodiments hereinafter that are the same as or similar to those previously described with reference to FIG. 2D may be omitted for brevity. In the embodiment, the semiconductor package structure 20f is similar to the semiconductor package structure 20d shown in FIG. 2D. As shown in FIG. 2F, unlike the semiconductor package structure 20d, the first semiconductor package of the semiconductor package structure 20f includes second conductive structures 140a, such as solder balls, that are electrically coupled between the first RDL structure 120 and the first package substrate 110.

Figure 3A:
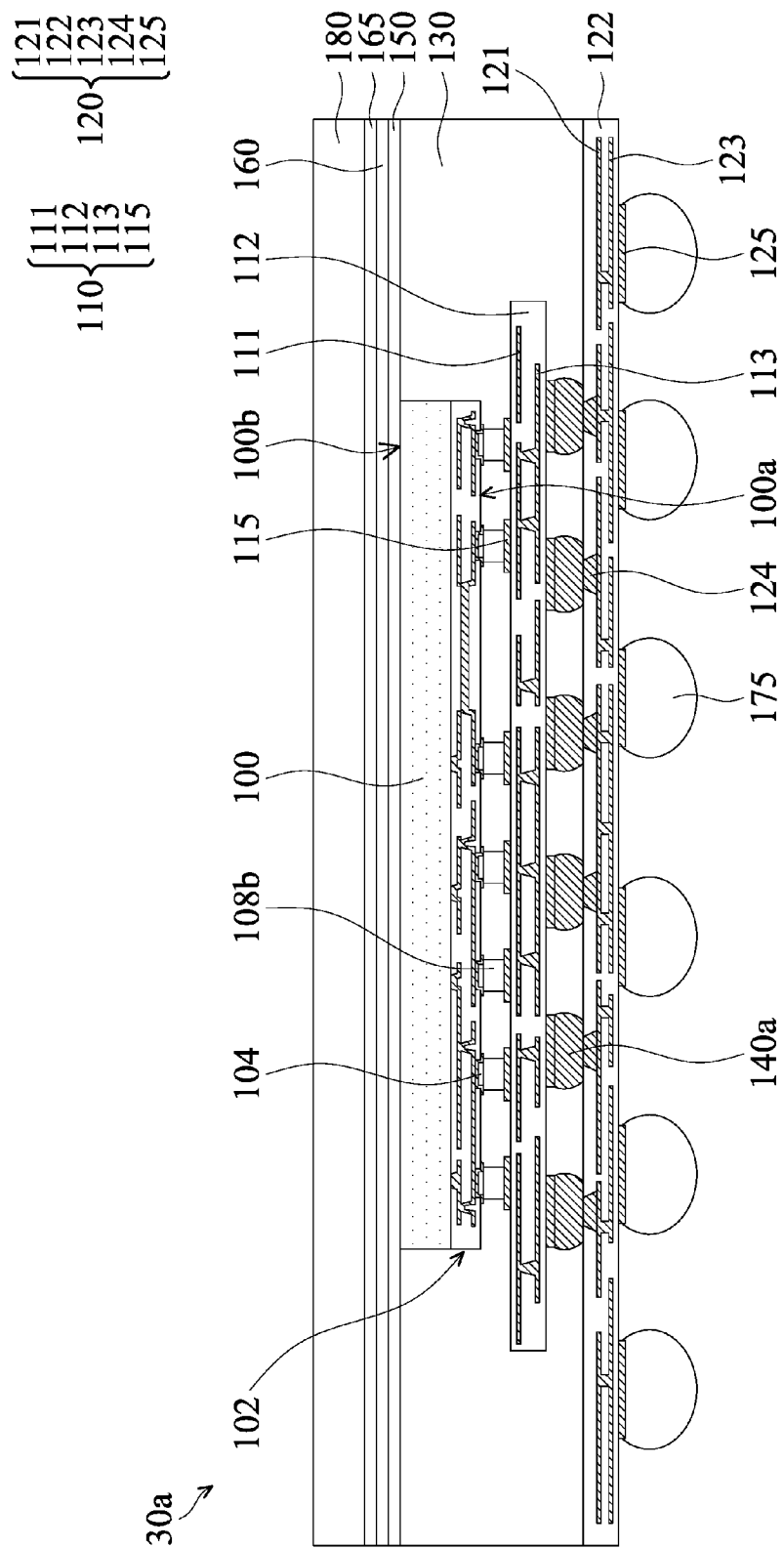
FIG. 3A is a cross-sectional view of a semiconductor package structure with a heat sink in accordance with some embodiments of the disclosure.

FIG. 3A is a cross-sectional view of a semiconductor package structure 30a with a heat sink in accordance with some embodiments of the disclosure. Descriptions of elements of the embodiments hereinafter that are the same as or similar to those previously described with reference to FIG. 1A may be omitted for brevity. In the embodiment, the semiconductor package structure 30a is similar to the semiconductor package structure 10a shown in FIG. 1A. As shown in FIG. 3A, unlike the semiconductor package structure 10a, the first semiconductor package of the semiconductor package structure 30a further includes a thermal interface material (TIM) layer 165 and a heat sink 180. In the embodiment, the heat sink 180 is disposed over first protective layer 160 and the TIM layer 165 is disposed between the first protective layer 160 and the heat sink 180.

In the embodiment, unlike the semiconductor package structure 10a, the first semiconductor package of the package structure 30a includes conductive structures 108b (such as copper bumps or pillars) that are electrically coupled between the first package substrate 110 and the first semiconductor die 100. In the embodiment, for example, the conductive pads 115 of the first package substrate 110 are connected to the corresponding copper bumps or pillars (i.e., the conductive structures 108b) that are connected to the corresponding conductive pads 104 of the interconnect structure 102 of the first semiconductor die 100. In some embodiments, solder balls 108a that are embedded in an underfill material layer 109 (as shown in FIG. 1A) may be used instead of the conductive structures 108b.

Figure 3B:
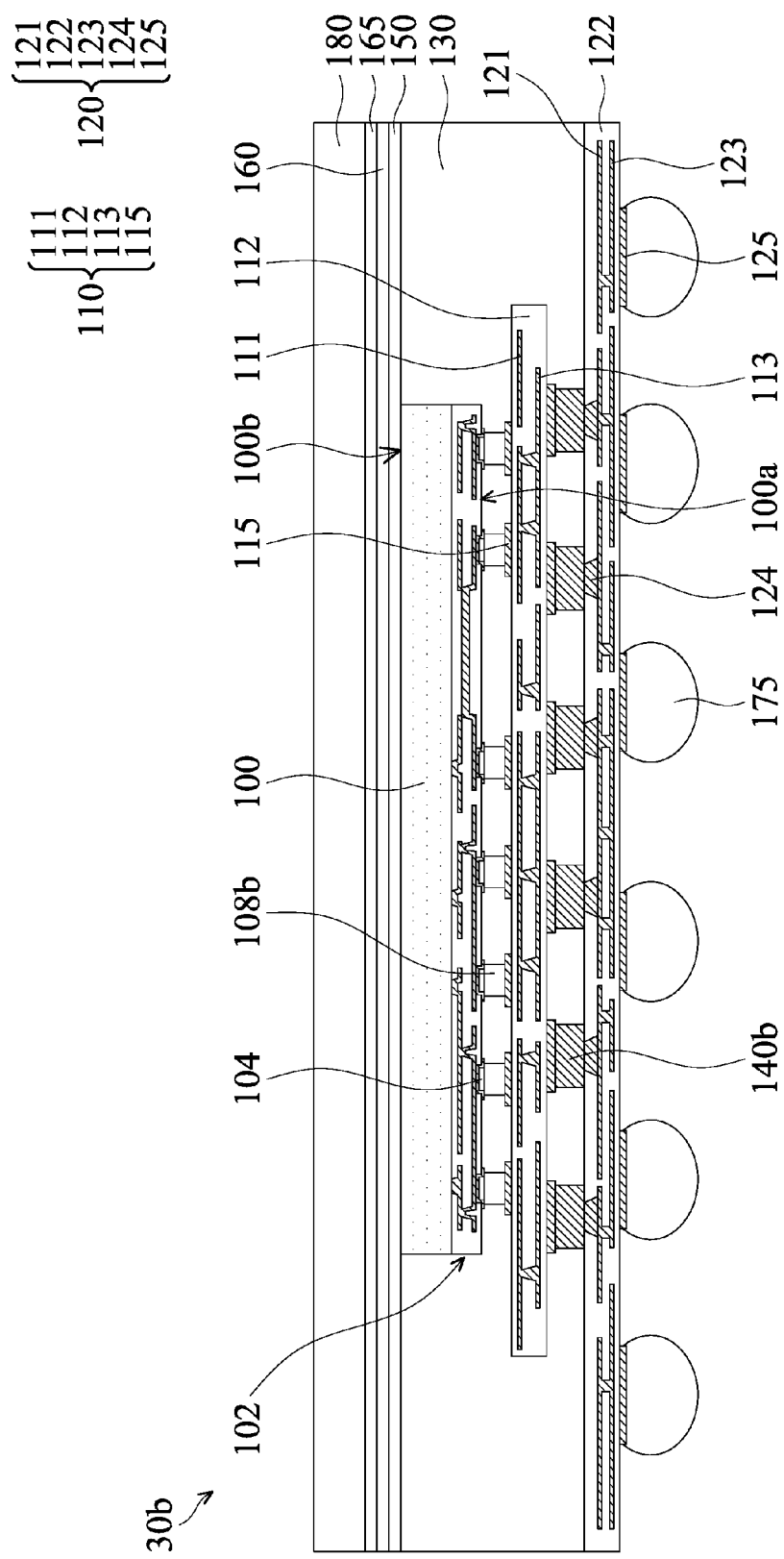
FIG. 3B is a cross-sectional view of a semiconductor package structure with a heat sink in accordance with some embodiments of the disclosure.

FIG. 3B is a cross-sectional view of a semiconductor package structure 30*b* with a heat sink in accordance with some embodiments of the disclosure. Descriptions of elements of the embodiments hereinafter that are the same as or similar to those previously described with reference to FIG. 3A may be omitted for brevity. In the embodiment, the semiconductor package structure 30*b* is similar to the semiconductor package structure 30*a* shown in FIG. 3A. As shown in FIG. 3B, unlike the semiconductor package structure 30*a*, the first semiconductor package of the semiconductor package structure 30*b* includes second conductive structures 140*b*, such as copper pillars or bumps, that are electrically coupled between the first RDL structure 120 and the first package substrate 110.

Similarly, in some embodiments, solder balls 108*a* that are embedded in an underfill material layer 109 (as shown in FIG. 1A) may be used instead of the conductive structures 108*b*.

Figure 3C:
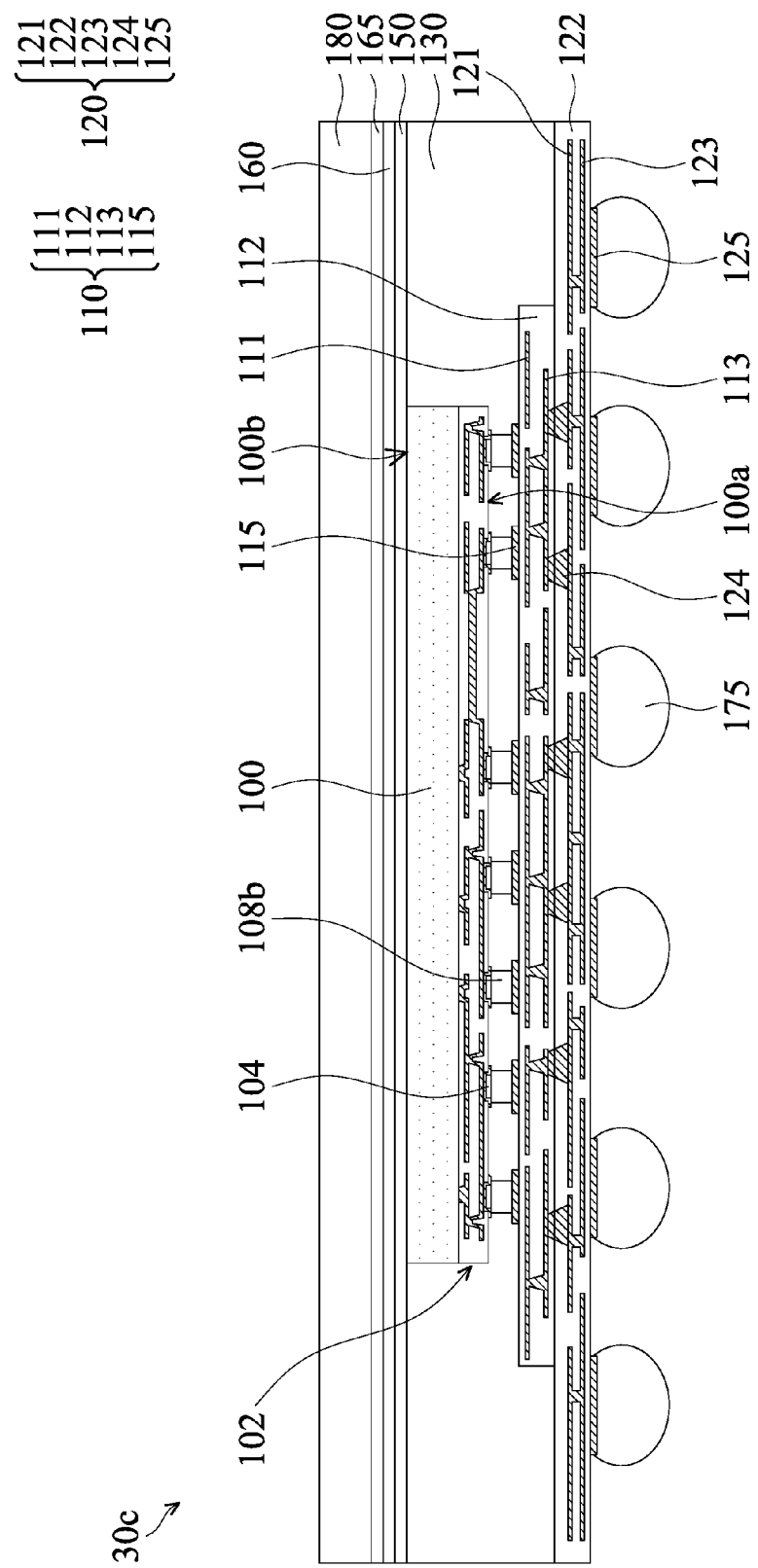
FIG. 3C is a cross-sectional view of a semiconductor package structure with a heat sink in accordance with some embodiments of the disclosure.

FIG. 3C is a cross-sectional view of a semiconductor package structure 30*c* with a heat sink in accordance with some embodiments of the disclosure. Descriptions of elements of the embodiments hereinafter that are the same as or similar to those previously described with reference to FIG. 3A may be omitted for brevity. In the embodiment, the semiconductor package structure 30*c* is similar to the semiconductor package structure 30*a* shown in FIG. 3A. As shown in FIG. 3C, unlike the semiconductor package structure 30*a*, in the first semiconductor package of the semiconductor package structure 30*c*, the first package substrate 110 is in direct contact with the first RDL structure 120. For example, pad portions (not shown) of the second conductive traces 113 in the first package substrate 110 are bonded to the corresponding pad portions 124 of the first conductive traces 121 in the first RDL structure 120.

Similarly, in some embodiments, first conductive structures 108*a* (e.g., solder balls) that are embedded in an underfill material layer 109 (as shown in FIG. 1A) may be used instead of the first conductive structures 108*b*.

Figure 4A:
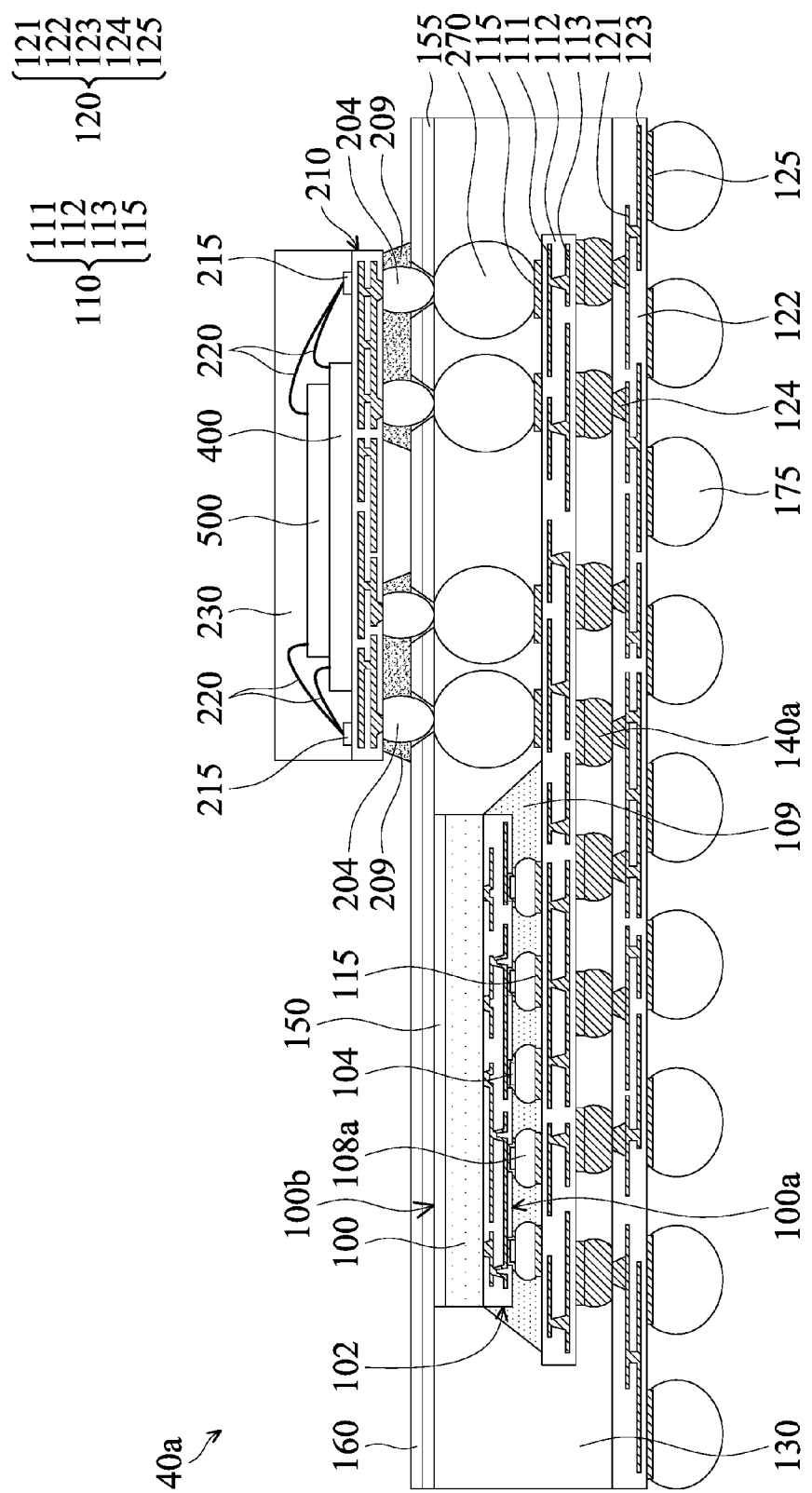
FIG. 4A is a cross-sectional view of a semiconductor package structure with a package-on-package (PoP) structure in accordance with some embodiments of the disclosure.

FIG. 4A is a cross-sectional view of a semiconductor package structure 40*a* with a PoP structure in accordance with some embodiments of the disclosure. Descriptions of elements of the embodiments hereinafter that are the same as or similar to those previously described with reference to FIG. 2A may be omitted for brevity. In the embodiment, the semiconductor package structure 40*a* is similar to the semiconductor package structure 20*a* shown in FIG. 2A. As shown in FIG. 4A, unlike the semiconductor package structure 20*a*, there is no through vias 170 disposed in the first molding compound 130. In the embodiment, the first semiconductor package of the semiconductor package structure 20*a* further includes a second semiconductor package disposed on the first semiconductor package. In some embodiments, the first semiconductor package may be a system-on-chip (SOC) package, and the second semiconductor package may be a dynamic random access memory (DRAM) package. In the embodiment, a projection of the first semiconductor die 100 onto the first RDL structure 120 is separated from a projection of the second semiconductor package onto the first RDL structure 120. In some embodiments, the projection of the first semiconductor die 100 onto the first RDL structure 120 may overlap with the projection of the second semiconductor package onto the first RDL structure 120.

In the embodiment, the second semiconductor package includes one or more second semiconductor dies disposed over the first molding compound 130 of the first semiconductor package. For example, two stacked second semiconductor dies 400 and 500 (such as DRAM dies) are disposed over the first molding compound 130.

Moreover, the second semiconductor package further includes a second package substrate 210 between the second semiconductor dies 400 and 500 and the first molding compound 130. In the embodiment, the package substrate 210 includes conductive pads 215 thereon and has a structure similar to that of the first package substrate 110. Moreover, the package substrate 210 is electrically coupled between the second semiconductor dies 400 and 500 and the first package substrate 110. For example, the second semiconductor dies 400 and 500 are electrically coupled to the second package substrate 210 via the conductive pads 250 and bonding wires 220.

Moreover, in the embodiment, the first semiconductor package further includes fourth conductive structures 270 (such as solder balls) that are embedded in the first molding compound 130, so as to be electrically coupled to the conductive pads 115 of the first package substrate 110. In this case, the first and second protective layers 160 and 155 have openings to expose the fourth conductive structures 270 in the first molding compound 130. An optional solder material (not shown) may fill these openings to contact the exposed fourth conductive structures 270.

Moreover, in the embodiment, the second semiconductor package further includes bumps 204 that are disposed on the second package substrate 210 and may be embedded in an underfill material layer 209. The bumps 204 are electrically coupled to the second package substrate 210 and the exposed fourth conductive structures 270.

In the embodiment, the second semiconductor package further includes a second molding compound 230 covering the second semiconductor dies 400 and 500, the bonding wires 220, and the second package substrate 210. In some embodiments, the second molding compound 230 is formed of a material that is the same as or similar to that of the first molding compound 130.

Figure 4B:
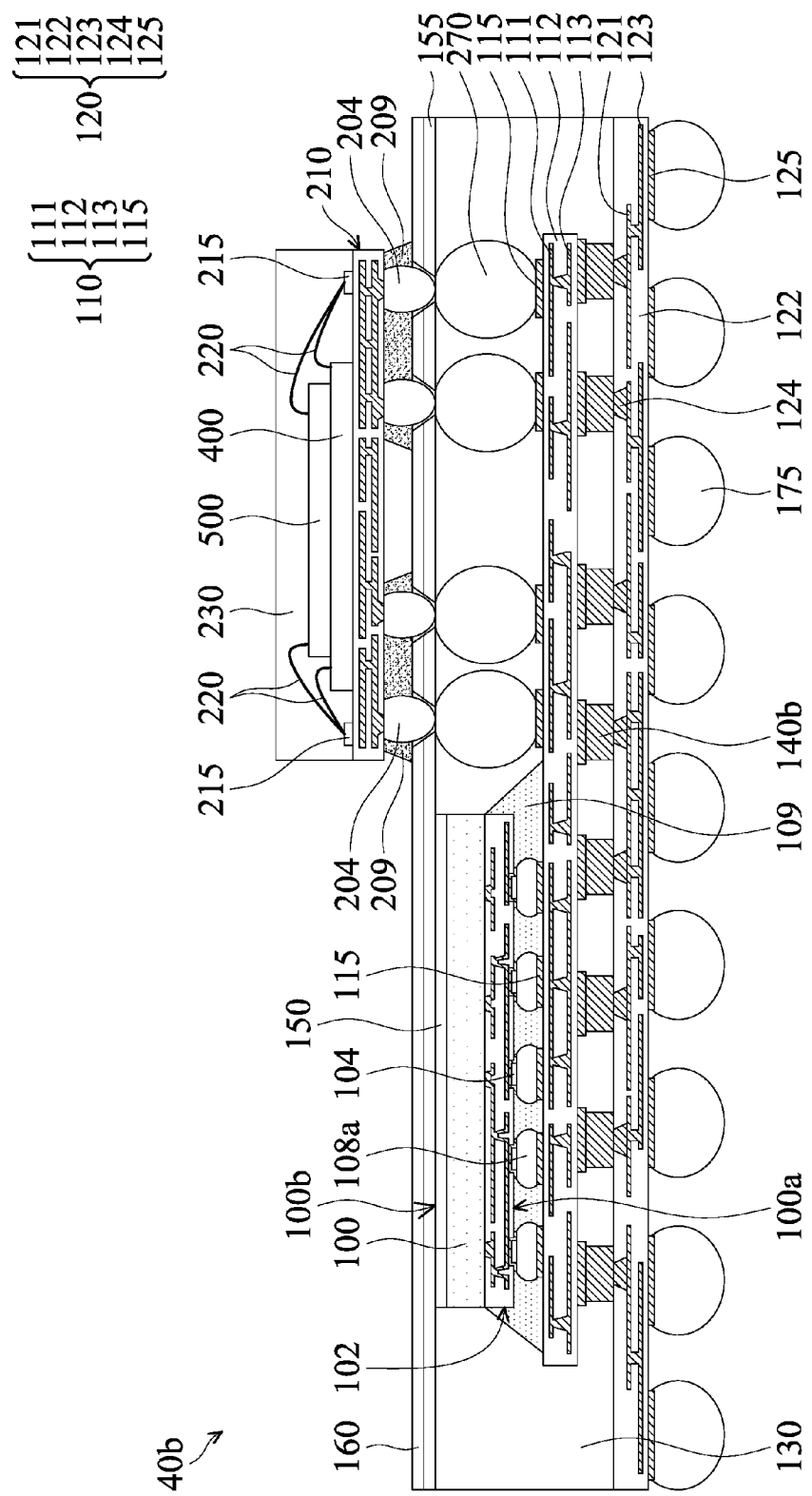
FIG. 4B is a cross-sectional view of a semiconductor package structure with a PoP structure in accordance with some embodiments of the disclosure.

FIG. 4B is a cross-sectional view of a semiconductor package structure 40*b* with a PoP structure in accordance with some embodiments of the disclosure. Descriptions of elements of the embodiments hereinafter that are the same as or similar to those previously described with reference to FIG. 4A may be omitted for brevity. In the embodiment, the semiconductor package structure 40*b* is similar to the semiconductor package structure 40*a* shown in FIG. 4A. As shown in FIG. 4B, unlike the semiconductor package structure 40*a*, the first semiconductor package of the semiconductor package structure 40*b* includes second conductive structures 140*b*, such as copper pillars or bumps, that are electrically coupled between the first RDL structure 120 and the first package substrate 110.

Figure 4C:
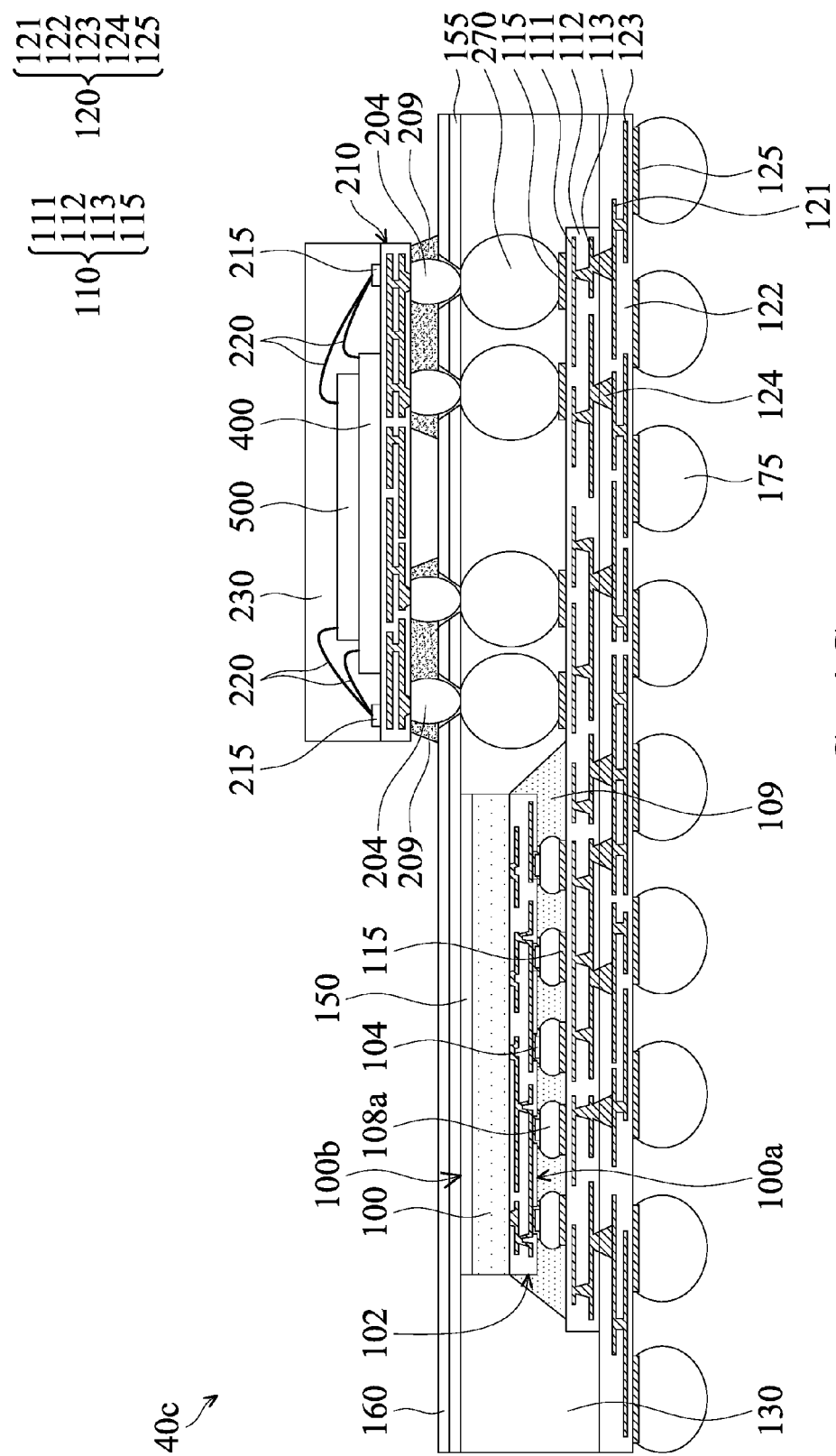
FIG. 4C is a cross-sectional view of a semiconductor package structure with a PoP structure in accordance with some embodiments of the disclosure.

FIG. 4C is a cross-sectional view of a semiconductor package structure 40*c* with a PoP structure in accordance with some embodiments of the disclosure. Descriptions of elements of the embodiments hereinafter that are the same as or similar to those previously described with reference to FIG. 4A may be omitted for brevity. In the embodiment, the semiconductor package structure 40*c* is similar to the semiconductor package structure 40*a* shown in FIG. 4A. As shown in FIG. 4C, unlike the semiconductor package structure 40*a*, in the first semiconductor package of the semiconductor package structure 40*c*, the first package substrate 110 is in direct contact with the first RDL structure 120. In the embodiment, for example, pad portions (not shown) of the second conductive traces 113 in the first package substrate 110 are bonded to the corresponding pad portions 124 of the first conductive traces 121 in the first RDL structure 120.

Figure 4D:
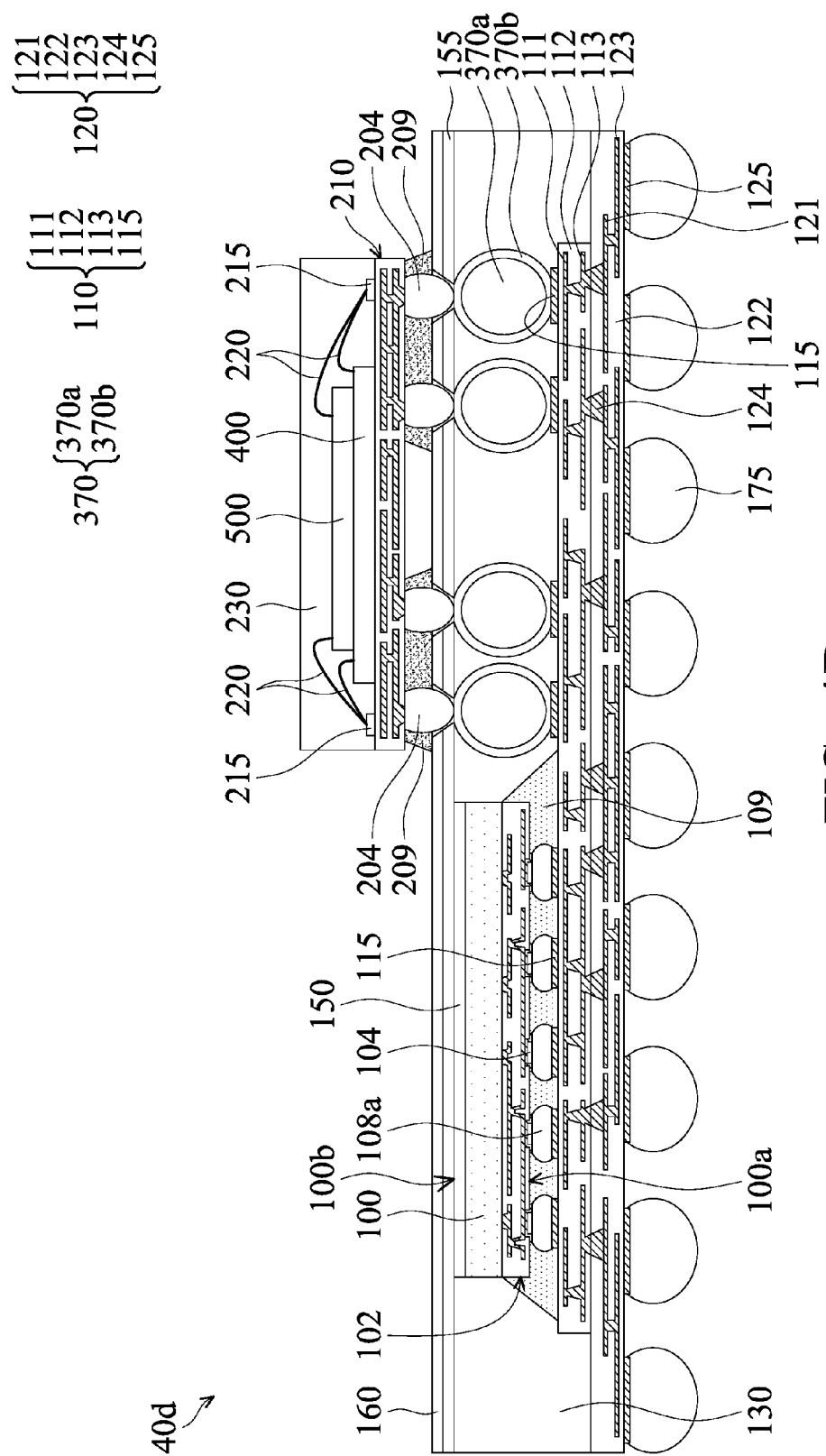
FIG. 4D is a cross-sectional view of a semiconductor package structure with a PoP structure in accordance with some embodiments of the disclosure.

FIG. 4D is a cross-sectional view of a semiconductor package structure 40d with a PoP structure in accordance with some embodiments of the disclosure. Descriptions of elements of the embodiments hereinafter that are the same as or similar to those previously described with reference to FIG. 4C may be omitted for brevity. In the embodiment, the semiconductor package structure 40d is similar to the semiconductor package structure 40c shown in FIG. 4C. As shown in FIG. 4D, unlike the semiconductor package structure 40c, the first semiconductor package of the semiconductor package structure 40d further includes fourth conductive structures 370 that are embedded in the first molding compound 130, so as to be electrically coupled to the conductive pads 115 of the first package substrate 110. In this case, the fourth conductive structure 370 may be a copper ball 370a covered by a solder material 370b. Moreover, the first and second protective layers 160 and 155 have openings to expose the fourth conductive structure 370 in the first molding compound 130. An optional solder material (not shown) may fill these openings to contact the exposed fourth conductive structure 370.

Figure 4E:
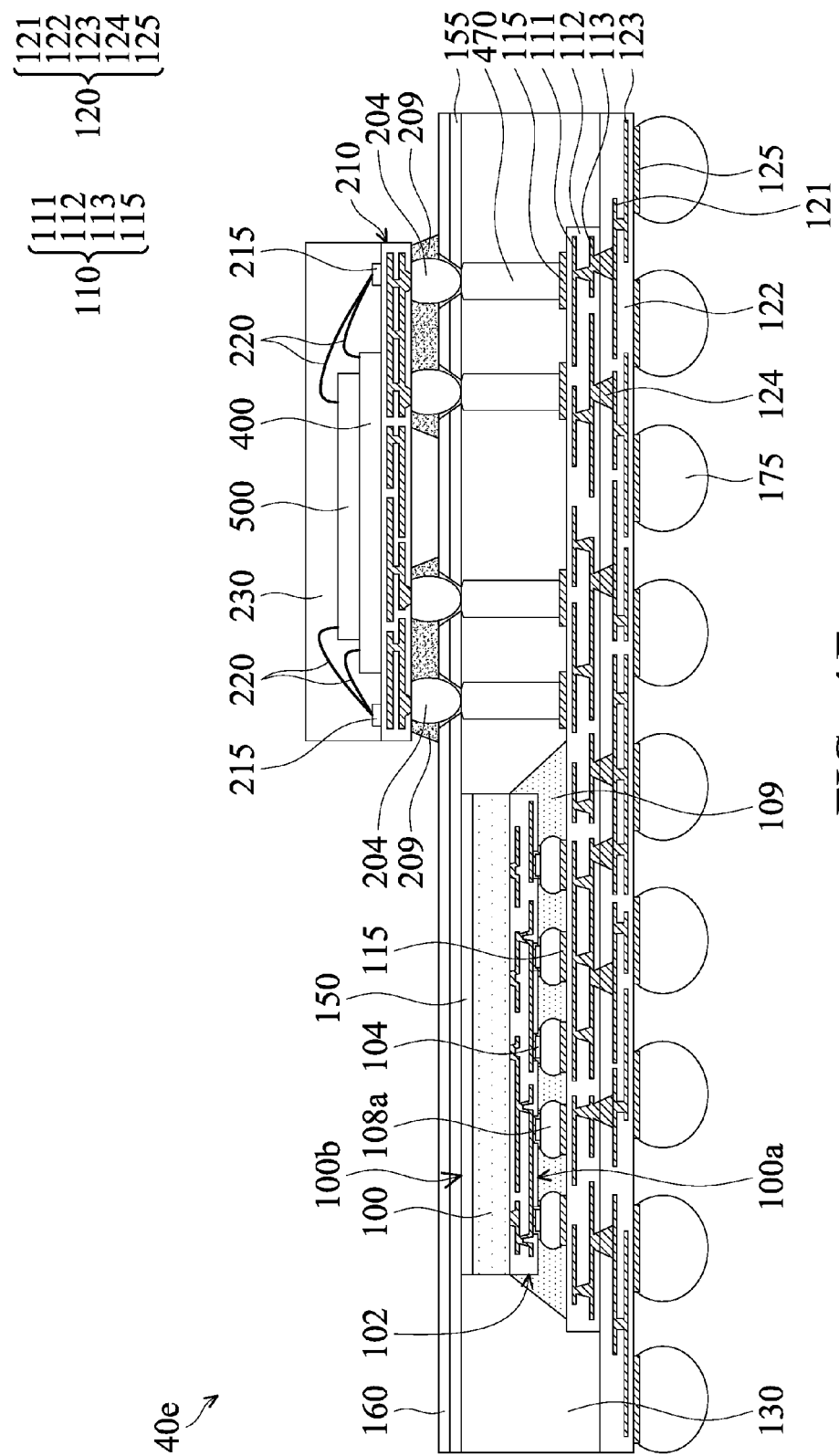
FIG. 4E is a cross-sectional view of a semiconductor package structure with a PoP structure in accordance with some embodiments of the disclosure.

FIG. 4E is a cross-sectional view of a semiconductor package structure 40e with a PoP structure in accordance with some embodiments of the disclosure. Descriptions of elements of the embodiments hereinafter that are the same as or similar to those previously described with reference to FIG. 4C may be omitted for brevity. In the embodiment, the semiconductor package structure 40e is similar to the semiconductor package structure 40c shown in FIG. 4C. As shown in FIG. 4E, unlike the semiconductor package structure 40c, the first semiconductor package of the semiconductor package structure 40e further includes fourth conductive structures 470 that are embedded in the first molding compound 130, so as to be electrically coupled to the conductive pads 115 of the first package substrate 110. In this case, the fourth conductive structure 470 may be a copper pillar. Moreover, the first and second protective layers 160 and 155 have openings to expose the fourth conductive structure 470 in the first molding compound 130. An optional solder material (not shown) may fill these openings to contact the exposed fourth conductive structure 470.

In the embodiments of FIGS. 4D and 4E, although the first package substrate 110 is in direct contact with the first RDL structure 120, the first semiconductor packages of the package structures 40d and 40e may include second conductive structures 140a (as shown in FIG. 4A) or second conductive structures 140b (as shown in FIG. 4B), so as to be electrically coupled between the first RDL structure 120 and the first package substrate 110.

Figure 5A:
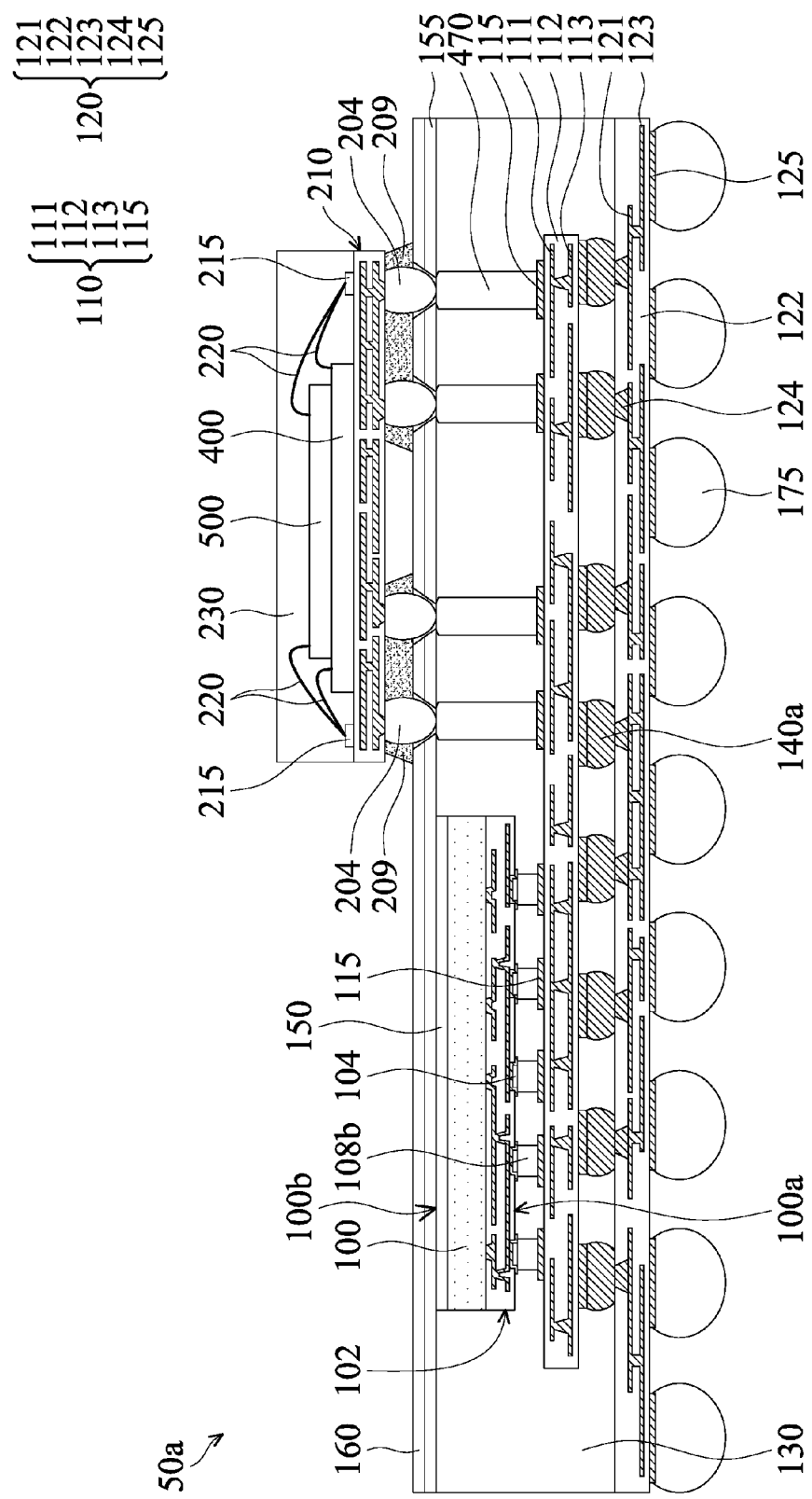
FIG. 5A is a cross-sectional view of a semiconductor package structure with a PoP structure in accordance with some embodiments of the disclosure.

FIG. 5A is a cross-sectional view of a semiconductor package structure 50a with a PoP structure in accordance with some embodiments of the disclosure. Descriptions of elements of the embodiments hereinafter that are the same as or similar to those previously described with reference to FIG. 4A may be omitted for brevity. In the embodiment, the semiconductor package structure 50a is similar to the semiconductor package structure 40a shown in FIG. 4A. As shown in FIG. 5A, unlike the semiconductor package structure 40a, the first semiconductor package of the semiconductor package structure 50a further includes fourth conductive structures 470 that are embedded in the first molding compound 130, so as to be electrically coupled to the conductive pads 115 of the first package substrate 110. In this case, the fourth conductive structure 470 may be a copper pillar. Moreover, the first and second protective layers 160 and 155 have openings to expose the fourth conductive structure 470 in the first molding compound 130. An optional solder material (not shown) may fill these openings to contact the exposed fourth conductive structure 470.

Moreover, in the embodiment, the first semiconductor package of the package structure 50a includes conductive structures 108b (such as copper bumps or pillars) that are electrically coupled between the first package substrate 110 and the first semiconductor die 100. In the embodiment, for example, the conductive pads 115 of the first package substrate 110 are connected to the corresponding copper bumps or pillars (i.e., the first conductive structures 108b) that are connected to the corresponding conductive pads 104 of the interconnect structure 102 of the first semiconductor die 100.

Figure 5B:
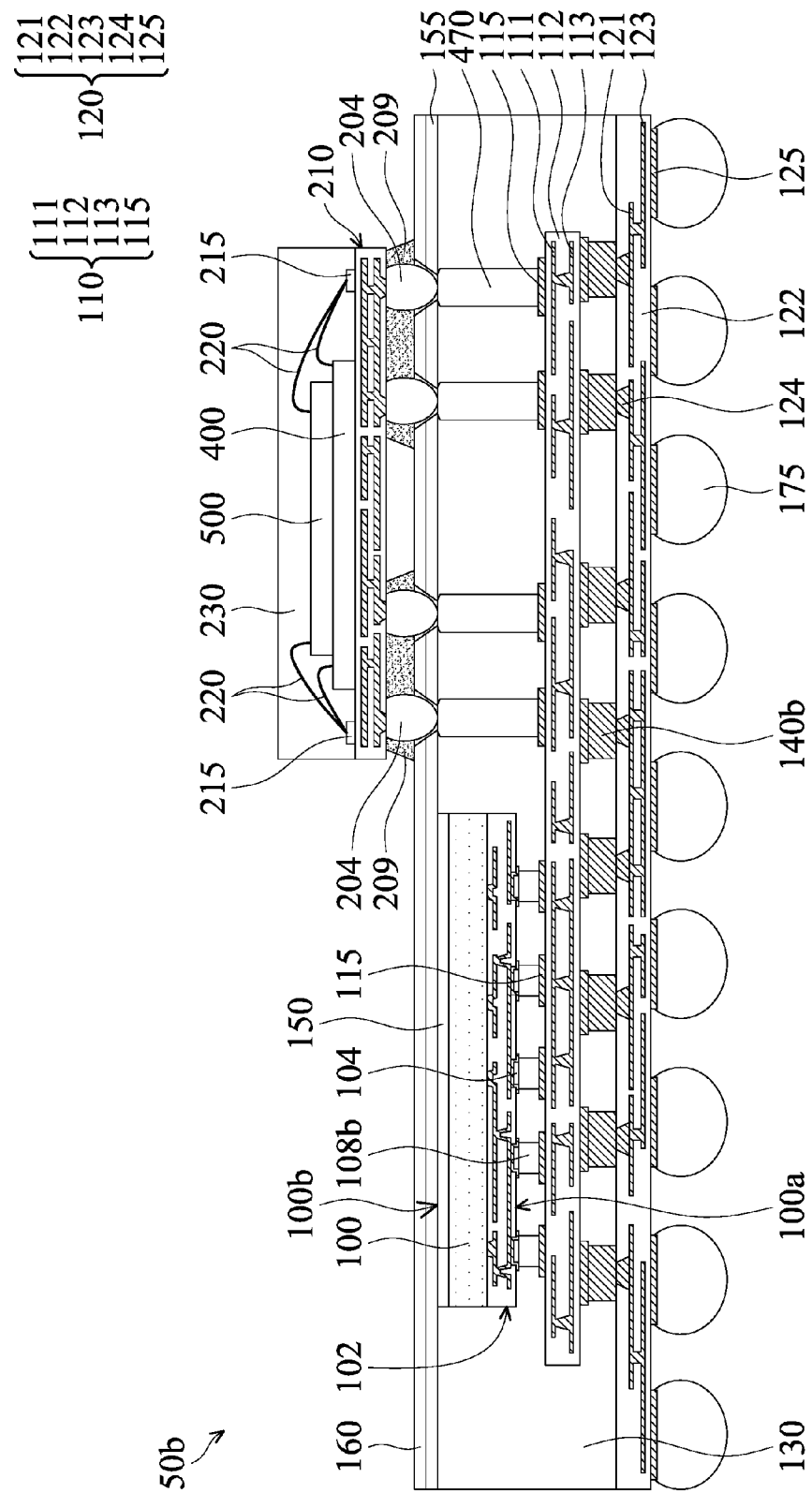
FIG. 5B is a cross-sectional view of a semiconductor package structure with a PoP structure in accordance with some embodiments of the disclosure.

FIG. 5B is a cross-sectional view of a semiconductor package structure 50b with a PoP structure in accordance with some embodiments of the disclosure. Descriptions of elements of the embodiments hereinafter that are the same as or similar to those previously described with reference to FIG. 5A may be omitted for brevity. In the embodiment, the semiconductor package structure 50b is similar to the semiconductor package structure 50a shown in FIG. 5A. As shown in FIG. 5B, unlike the semiconductor package structure 50a, the first semiconductor package of the semiconductor package structure 50b includes second conductive structures 140b, such as copper pillars or bumps, that are electrically coupled between the first RDL structure 120 and the first package substrate 110.

Figure 5C:
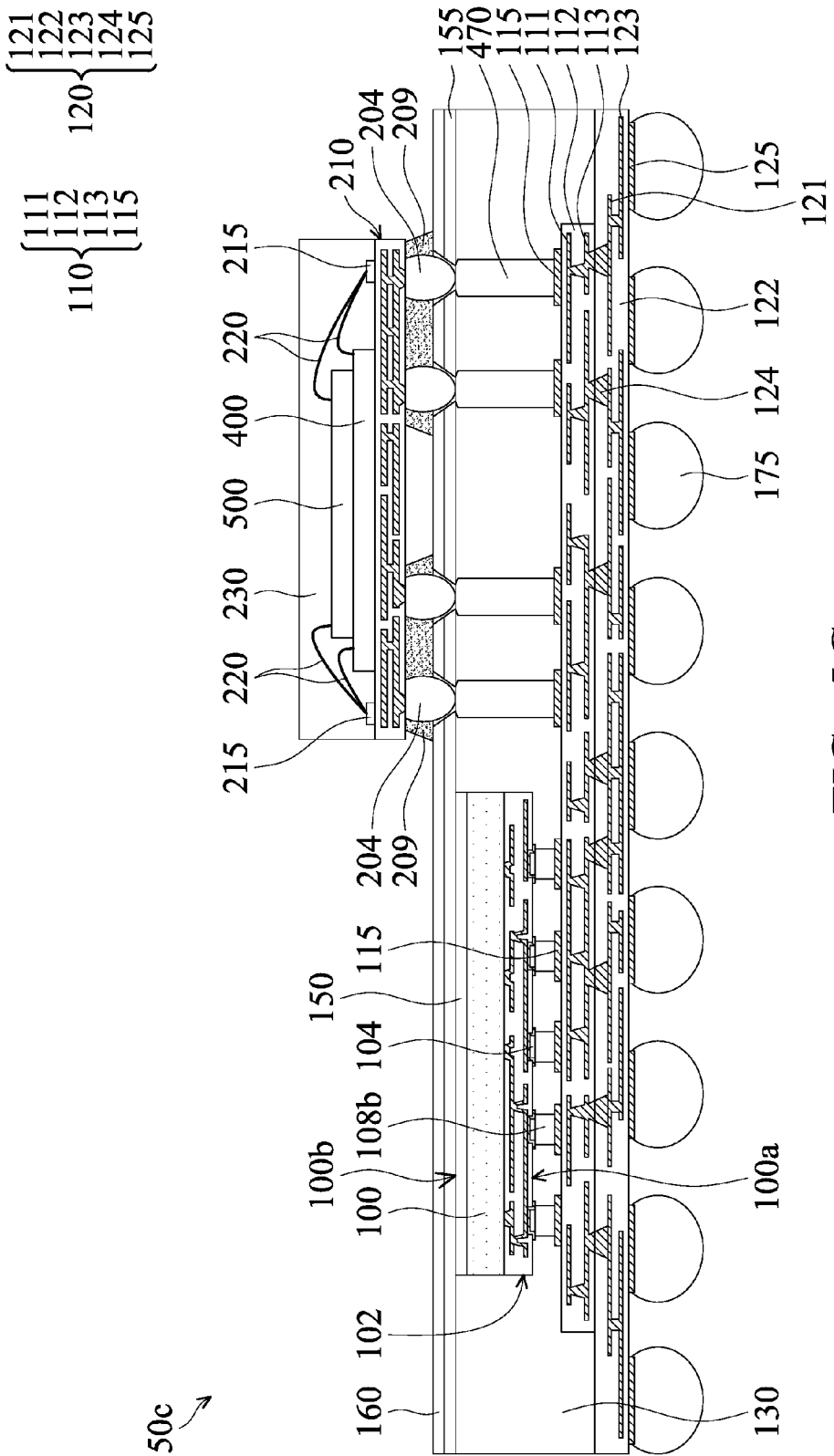
FIG. 5C is a cross-sectional view of a semiconductor package structure with a PoP structure in accordance with some embodiments of the disclosure.

FIG. 5C is a cross-sectional view of a semiconductor package structure 50c with a PoP structure in accordance with some embodiments of the disclosure. Descriptions of elements of the embodiments hereinafter that are the same as or similar to those previously described with reference to FIG. 5A may be omitted for brevity. In the embodiment, the semiconductor package structure 50c is similar to the semiconductor package structure 50a shown in FIG. 5A. As shown in FIG. 5C, unlike the semiconductor package structure 50a, in the first semiconductor package of the semiconductor package structure 50c, the first package substrate 110 is in direct contact with the first RDL structure 120. In the embodiment, for example, pad portions (not shown) of the second conductive traces 113 in the first package substrate 110 are bonded to the corresponding pad portions 124 of the first conductive traces 121 in the first RDL structure 120.

Figure 5D:
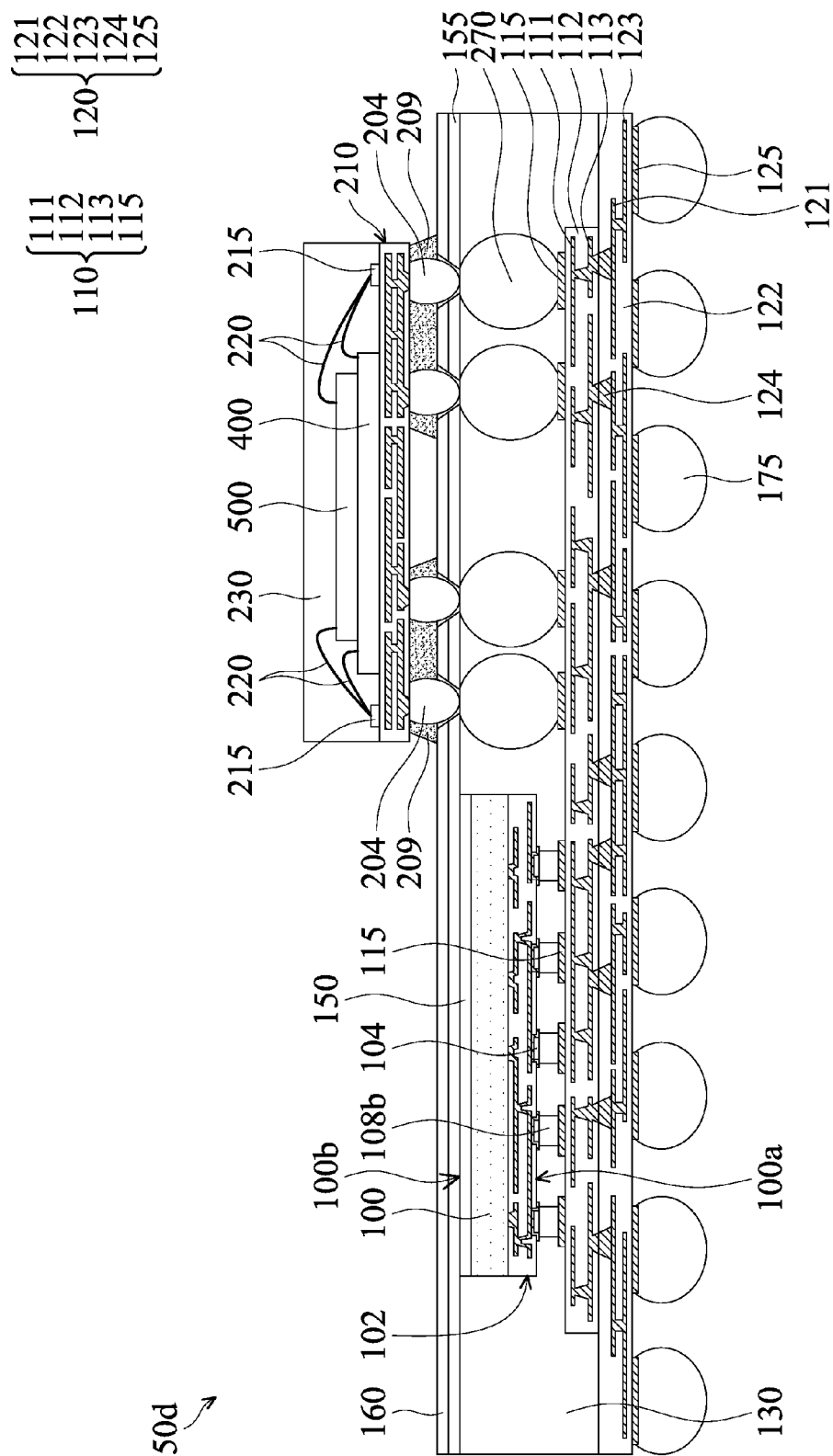
FIG. 5D is a cross-sectional view of a semiconductor package structure with a PoP structure in accordance with some embodiments of the disclosure.

FIG. 5D is a cross-sectional view of a semiconductor package structure 50d with a PoP structure in accordance with some embodiments of the disclosure. Descriptions of elements of the embodiments hereinafter that are the same as or similar to those previously described with reference to FIG. 5C may be omitted for brevity. In the embodiment, the semiconductor package structure 50d is similar to the semiconductor package structure 50c shown in FIG. 5C. As shown in FIG. 5D, unlike the semiconductor package structure 40c, the first semiconductor package of the semiconductor package structure 50d further includes fourth conductive structures 270 (such as solder balls) that are embedded in the first molding compound 130, so as to be electrically coupled to the conductive pads 115 of the first package substrate 110. In this case, the first and second protective layers 160 and 155 have openings to expose the fourth conductive structures 270 in the first molding compound 130. An optional solder material (not shown) may fill these openings to contact the exposed fourth conductive structures 270.

Figure 5E:
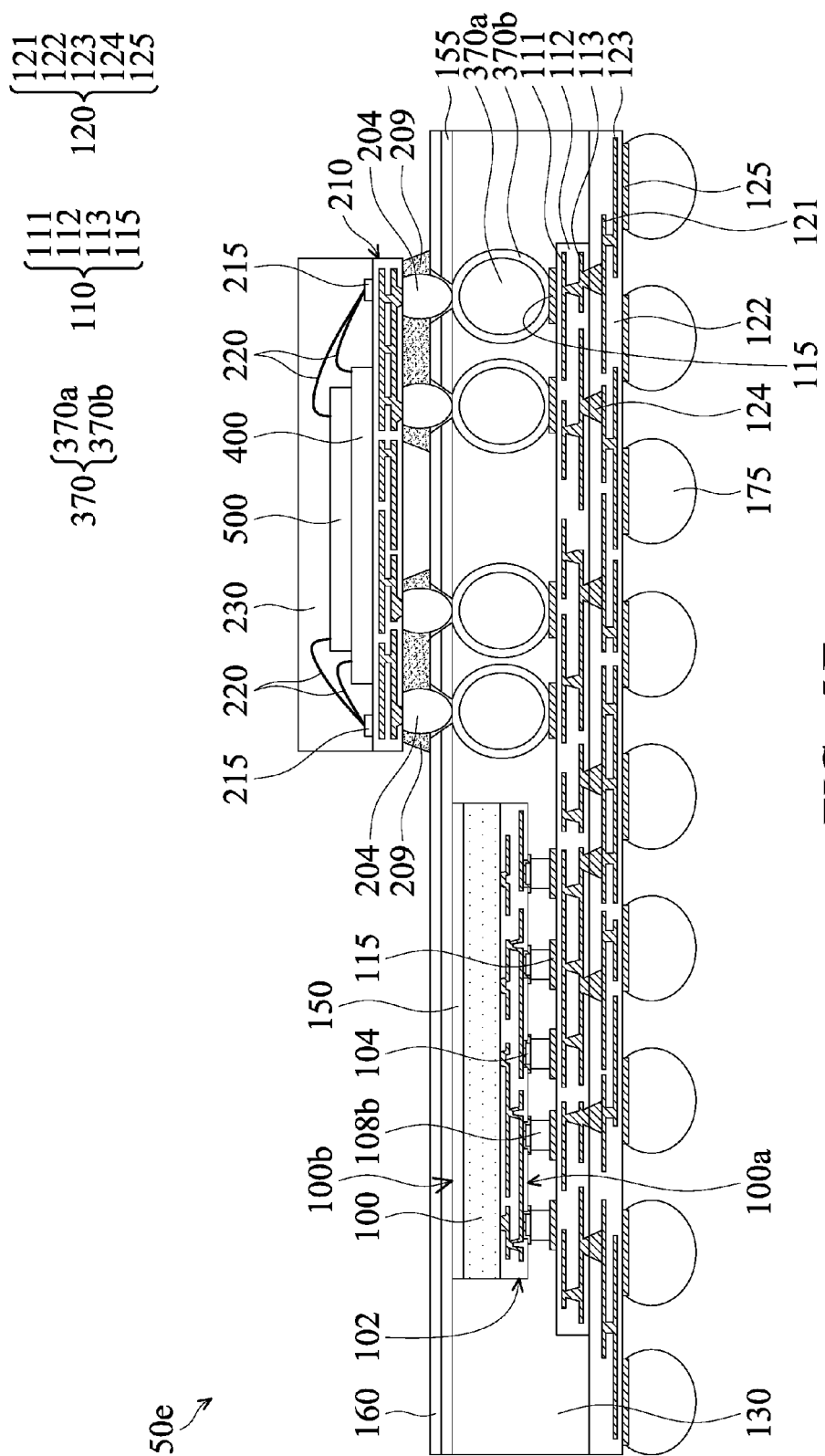
FIG. 5E is a cross-sectional view of a semiconductor package structure with a PoP structure in accordance with some embodiments of the disclosure.

FIG. 5E is a cross-sectional view of a semiconductor package structure 50e with a PoP structure in accordance with some embodiments of the disclosure. Descriptions of elements of the embodiments hereinafter that are the same as or similar to those previously described with reference to FIG. 5C may be omitted for brevity. In the embodiment, the semiconductor package structure 50e is similar to the semiconductor package structure 50c shown in FIG. 5C. As shown in FIG. 5E, unlike the semiconductor package structure 50c, the first semiconductor package of the semiconductor package structure 50e further includes fourth conductive structures 370 that are embedded in the first molding compound 130, so as to be electrically coupled to the conductive pads 115 of the first package substrate 110. In this case, the fourth conductive structure 370 may be a copper ball 370a covered by a solder material 370b. Moreover, the first and second protective layers 160 and 155 have openings to expose the fourth conductive structure 370 in the first molding compound 130. An optional solder material (not shown) may fill these openings to contact the exposed fourth conductive structure 370.

In the embodiments of FIGS. 5D and 5E, although the first package substrate 110 is in direct contact with the first RDL structure 120, the first semiconductor packages of the package structures 50d and 50e may include second conductive structures 140a (as shown in FIG. 5A) or second conductive structures 140b (as shown in FIG. 5B), so as to be electrically coupled between the first RDL structure 120 and the first package substrate 110.

According to the foregoing embodiments, since the semiconductor package utilizes a combination of an embedded-type package substrate and an RDL as a fan-out layer of the semiconductor package structure, compared to a conventional semiconductor package structure that merely utilizes a package substrate with a complicated multilayer interconnect structure therein as a fan-out layer, the number of interconnect layers in the embedded-type package substrate can be reduced, so as to simplify the structure thereof. Moreover, since the required interconnect layers in the embedded-type package substrate is reduced by the use of an additional RDL, the warpage in the semiconductor package structure can be mitigated or improved. As a result, the size of the package substrate can be reduced, thereby reducing the manufacturing cost of the semiconductor package structure, reducing the size of the semiconductor package structure, and increasing the yield of the package substrate. Moreover, the reliability, yield, and throughput of the semiconductor package structure are increased.

Additionally, compared to the conventional semiconductor package structure, the pitch of I/O pads for the semiconductor package structure that utilizes a combination of an embedded-type package substrate and an RDL as a fan-out layer can be maintained. Therefore, the modification of a PCB that is mounted to the semiconductor package structure is not necessary.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A semiconductor package structure, comprising:
 a first semiconductor package comprising:
  a first semiconductor die having a first surface and a second surface opposite thereto;
  a first package substrate disposed on the first surface of the first semiconductor die;
  a first molding compound in physical contact with the first semiconductor die and the first package substrate;
  a first protective layer disposed over the second surface of the first semiconductor die and the first molding compound;
  a first redistribution layer (RDL) structure disposed on the first molding compound, wherein the first package substrate is interposed and electrically coupled between the first semiconductor die and the first RDL structure; and
  a plurality of through vias passing through the first molding compound and electrically coupled to the first RDL structure.
2. The semiconductor package structure as claimed in claim 1, wherein the first semiconductor die includes an interconnect structure adjacent to the first surface of the first semiconductor die.
3. The semiconductor package structure as claimed in claim 2, wherein the interconnect structure is an RDL structure.
4. The semiconductor package structure as claimed in claim 1, wherein the first package substrate is electrically coupled to the first semiconductor die via a plurality of first conductive structures that is embedded in an underfill material layer.
5. The semiconductor package structure as claimed in claim 1, wherein the first package substrate is electrically coupled to the first RDL structure via a plurality of second conductive structures.
6. The semiconductor package structure as claimed in claim 1, wherein the first package substrate is in direct contact with the first RDL structure.
7. The semiconductor package structure as claimed in claim 1, wherein the first semiconductor package further comprises:
 a plurality of third conductive structures disposed on and electrically coupled to the first RDL structure, wherein the first RDL structure is between the first package substrate and the plurality of third conductive structures.
8. The semiconductor package structure as claimed in claim 1, wherein the first semiconductor package further comprises:
 an adhesion layer disposed between the first protective layer and the first semiconductor die.
9. The semiconductor package structure as claimed in claim 8, wherein the first semiconductor package further comprises:
 a heat sink disposed over first protective layer; and
 a thermal interface material layer disposed between the first protective layer and the heat sink.
10. The semiconductor package structure as claimed in claim 8, wherein the first semiconductor package further comprises a second protective layer disposed between the first protective layer and the adhesion layer.
11. A semiconductor package structure, comprising:
 a first semiconductor package comprising:
  a first semiconductor die having a first surface and a second surface opposite thereto;

a first package substrate disposed on the first surface of the first semiconductor die;

a first molding compound in physical contact with the first semiconductor die and the first package substrate;

a first protective layer disposed over the second surface of the first semiconductor die and the first molding compound; and a first RDL structure disposed on the first molding compound, wherein the first package substrate is interposed and electrically coupled between the first semiconductor die and the first RDL structure; and a second semiconductor package disposed on the first semiconductor package and comprising:

at least one second semiconductor die disposed over the first molding compound;

a second package substrate disposed between the at least one second semiconductor die and the first molding compound and electrically coupled between the at least one second semiconductor die and the first package substrate; and a second molding compound covering the at least one second semiconductor die and the second package substrate.

12. The semiconductor package structure as claimed in claim 11, wherein the first semiconductor die includes an interconnect structure adjacent to the first surface of the first semiconductor die.

13. The semiconductor package structure as claimed in claim 12, wherein the interconnect structure is an RDL structure.

14. The semiconductor package structure as claimed in claim 11, wherein the first package substrate is electrically coupled to the first semiconductor die via a plurality of first conductive structures that is embedded in an underfill material layer.

15. The semiconductor package structure as claimed in claim 11, wherein the first package substrate is electrically coupled to the first RDL structure via a plurality of second conductive structures.

16. The semiconductor package structure as claimed in claim 11, wherein the first package substrate is in direct contact with the first RDL structure.

17. The semiconductor package structure as claimed in claim 11, wherein the first semiconductor package further comprises a plurality of third conductive structures disposed on and electrically coupled to the first RDL structure, and wherein the first RDL structure is between the first package substrate and the plurality of third conductive structures.

18. The semiconductor package structure as claimed in claim 11, wherein the first semiconductor package further comprises:

an adhesion layer disposed between the first protective layer and the first semiconductor die; and a second protective layer disposed between the first protective layer and the adhesion layer.

19. The semiconductor package structure as claimed in claim 11, wherein the first semiconductor package further comprises a plurality of fourth conductive structures embedded in the first molding compound and electrically coupled between the second package substrate and the first package substrate.

20. The semiconductor package structure as claimed in claim 19, wherein each of the plurality of fourth conductive structures comprises a copper pillar or a solder ball.

21. The semiconductor package structure as claimed in claim 19, wherein each of the plurality of fourth conductive structures comprises a copper ball covered by a solder material.

22. The semiconductor package structure as claimed in claim 19, wherein the second semiconductor package further comprises a plurality of bumps disposed on the second package substrate and electrically coupled between the second package substrate and the plurality of fourth conductive structures.

23. The semiconductor package structure as claimed in claim 11, wherein a projection of the first semiconductor die onto the first RDL structure is separated from a projection of the second semiconductor package onto the first RDL structure.

24. The semiconductor package structure as claimed in claim 11, wherein the first semiconductor package is a system-on-chip (SOC) package, and the second semiconductor package is a dynamic random access memory (DRAM) package.

25. A semiconductor package structure, comprising:
a first semiconductor package comprising:
a first semiconductor die having a first surface and a second surface opposite thereto;
a first package substrate disposed on the first surface of the first semiconductor die;
a first molding compound in physical contact with the first semiconductor die and the first package substrate;
a first protective layer disposed over the second surface of the first semiconductor die and the first molding compound, wherein the first protective layer is configured to protect the first semiconductor die and the first molding compound; and
a first redistribution layer (RDL) structure disposed on the first molding compound, wherein the first package substrate is interposed and electrically coupled between the first semiconductor die and the first RDL structure.

26. The semiconductor package structure of claim 25, wherein the first protective layer comprises a protective film.

* * * * *